US012283478B2

(12) United States Patent
Hashimoto et al.

(10) Patent No.: US 12,283,478 B2
(45) Date of Patent: *Apr. 22, 2025

(54) PROCESSING METHOD, METHOD OF MANUFACTURING SEMICONDUCTOR DEVICE, PROCESSING APPARATUS, AND RECORDING MEDIUM

(71) Applicant: Kokusai Electric Corporation, Tokyo (JP)

(72) Inventors: Yoshitomo Hashimoto, Toyama (JP); Kimihiko Nakatani, Toyama (JP); Takayuki Waseda, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/422,641

(22) Filed: Jan. 25, 2024

(65) Prior Publication Data
US 2024/0170280 A1 May 23, 2024

Related U.S. Application Data

(63) Continuation of application No. 18/081,277, filed on Dec. 14, 2022, now Pat. No. 11,935,742, which is a
(Continued)

(30) Foreign Application Priority Data

Apr. 19, 2021 (JP) ................. 2021-070590

(51) Int. Cl.
*H01L 21/02* (2006.01)
*C23C 16/46* (2006.01)
(52) U.S. Cl.
CPC ........ *H01L 21/02211* (2013.01); *C23C 16/46* (2013.01)

(58) Field of Classification Search
CPC ......... H01L 21/02211; H01L 21/02603; H01L 29/0653; H01L 29/0673; H01L 29/42392;
(Continued)

(56) References Cited

U.S. PATENT DOCUMENTS 7,625,820 B1  12/2009  Papasouliotis et al.
11,626,280 B2 *  4/2023  Hashimoto ....... H01L 21/02126
                                                                        438/584
(Continued)

FOREIGN PATENT DOCUMENTS

CN     109411352 A    3/2019
CN     111063690 A    4/2020
(Continued)

OTHER PUBLICATIONS

Extended European Search Report issue on Sep. 8, 2022 for European Patent Application No. 22162524.7.
(Continued)

*Primary Examiner* — Brook Kebede
(74) *Attorney, Agent, or Firm* — Volpe Koenig

(57) ABSTRACT

There is provided a technique that includes: (a) forming an inhibitor layer on a surface of a first material of a concave portion provided on a surface of a substrate, by supplying a precursor to the substrate to adsorb at least a portion of a molecular structure of molecules constituting the precursor on the surface of the first material of the concave portion, the concave portion being composed of the first material containing a first element and a second material containing a second element different from the first element; (b) growing a film on a surface of the second material of the concave portion by supplying a film-forming material to the substrate having the inhibitor layer formed on the surface of the first material; and (c) forming a hydroxyl group termination on the surface of the first material before performing (a).

21 Claims, 13 Drawing Sheets

Related U.S. Application Data continuation of application No. 17/697,533, filed on Mar. 17, 2022, now Pat. No. 11,626,280.

(58) Field of Classification Search
CPC ......... H01L 29/66439; H01L 29/66795; H01L 29/775; H01L 29/785; H01L 29/78696; C23C 16/4481; C23C 16/46
See application file for complete search history.

(56) References Cited

U.S. PATENT DOCUMENTS

| | | | |
|---|---|---|---|
| 11,935,742 B2* | 3/2024 | Hashimoto | ............. C23C 16/46 |
| 2002/0155722 A1 | 10/2002 | Satta et al. | |
| 2014/0287596 A1 | 9/2014 | Hirose et al. | |
| 2016/0163725 A1 | 6/2016 | Kamiya et al. | |
| 2017/0194430 A1 | 7/2017 | Wood et al. | |
| 2017/0342553 A1 | 11/2017 | Yu et al. | |
| 2018/0166270 A1 | 6/2018 | Cho et al. | |
| 2018/0211833 A1 | 7/2018 | Li et al. | |
| 2019/0085459 A1 | 3/2019 | Sone et al. | |
| 2019/0181224 A1* | 6/2019 | Zhang | ............... H01L 29/66553 |
| 2019/0214459 A1* | 7/2019 | Cheng | .................... B82Y 10/00 |
| 2020/0185413 A1 | 6/2020 | Kim et al. | |
| 2020/0266060 A1 | 8/2020 | Cheng et al. | |
| 2020/0402792 A1 | 12/2020 | Ke et al. | |

FOREIGN PATENT DOCUMENTS

| | | |
|---|---|---|
| JP | 2014-183218 A | 9/2014 |
| JP | 2017-069407 A | 4/2017 |
| JP | 2017-222928 A | 12/2017 |
| JP | 2020-188279 A | 11/2020 |
| KR | 10-2018-0066919 A | 6/2018 |
| KR | 10-2018-0135024 A | 12/2018 |
| TW | 201836023 A | 10/2018 |

OTHER PUBLICATIONS

Taiwanese Office Action issued Dec. 12, 2022 for Taiwanese Patent Application No. 111103484.
Japanese Office Action issued on Feb. 28, 2023 for Japanese Patent Application No. 2021-070590.
Singapore Search Report issued on Jul. 24, 2023 for Singapore Patent Application No. 10202202740R.
Singapore Written Opinion issued on Jul. 24, 2023 for Singapore Patent Application No. 10202202740R.
Korean Office Action issued Jan. 19, 2024 for Korean Patent Application No. 10-2022-0033116.

* cited by examiner

PROCESSING METHOD, METHOD OF MANUFACTURING SEMICONDUCTOR DEVICE, PROCESSING APPARATUS, AND RECORDING MEDIUM

CROSS-REFERENCE TO RELATED APPLICATION

This non-provisional U.S. patent application is a continuation of U.S. patent application Ser. No. 18/081,277, filed Dec. 14, 2022, U.S. patent application Ser. No. 17/697,533, filed Mar. 17, 2022 that has issued as U.S. Pat. No. 11,626,280 issued on Apr. 11, 2023, and claims the benefit of priority from Japanese Patent Application No. 2021-070590, filed on Apr. 19, 2021, the entire contents of which are incorporated herein by reference.

TECHNICAL FIELD

The present disclosure relates to a method of processing a substrate, a method of manufacturing a semiconductor device, a substrate processing apparatus, and a recording medium.

BACKGROUND

As a process of manufacturing a semiconductor device, a process of forming a film on the surface of a substrate may be often carried out. In this case, the film may be formed so as to bury the inside of a concave portion provided on the surface of the substrate.

SUMMARY

Some embodiments of the present disclosure provide a technique capable of improving burial characteristics when burying the inside of a concave portion with a film.

According to one embodiment of the present disclosure, there is provided a technique that includes: (a) forming a film formation suppression layer on a surface, which is composed of a first material, of a concave portion of the substrate, by supplying a precursor to the substrate provided with the concave portion on a surface of the substrate to adsorb at least a portion of a molecular structure of molecules constituting the precursor on the surface of the first material of the concave portion, the concave portion having a top surface and a side surface composed of the first material containing a first element and a bottom surface composed of a second material containing a second element; and (b) growing a film on a surface of the second material of the concave portion by supplying a film-forming material to the substrate having the film formation suppression layer formed on the surface of the first material.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

One Embodiment of the Present Disclosure

One embodiment of the present disclosure will now be described mainly with reference to FIGS. 1 to 4 and 5A to 5D. The drawings used in the following description are all schematic, and the dimensional relationship, ratios, and the like of various elements shown in figures do not always match the actual ones. Further, the dimensional relationship, ratios, and the like of various elements between plural figures do not always match each other.

(1) Configuration of Substrate Processing Apparatus

Figure 1:
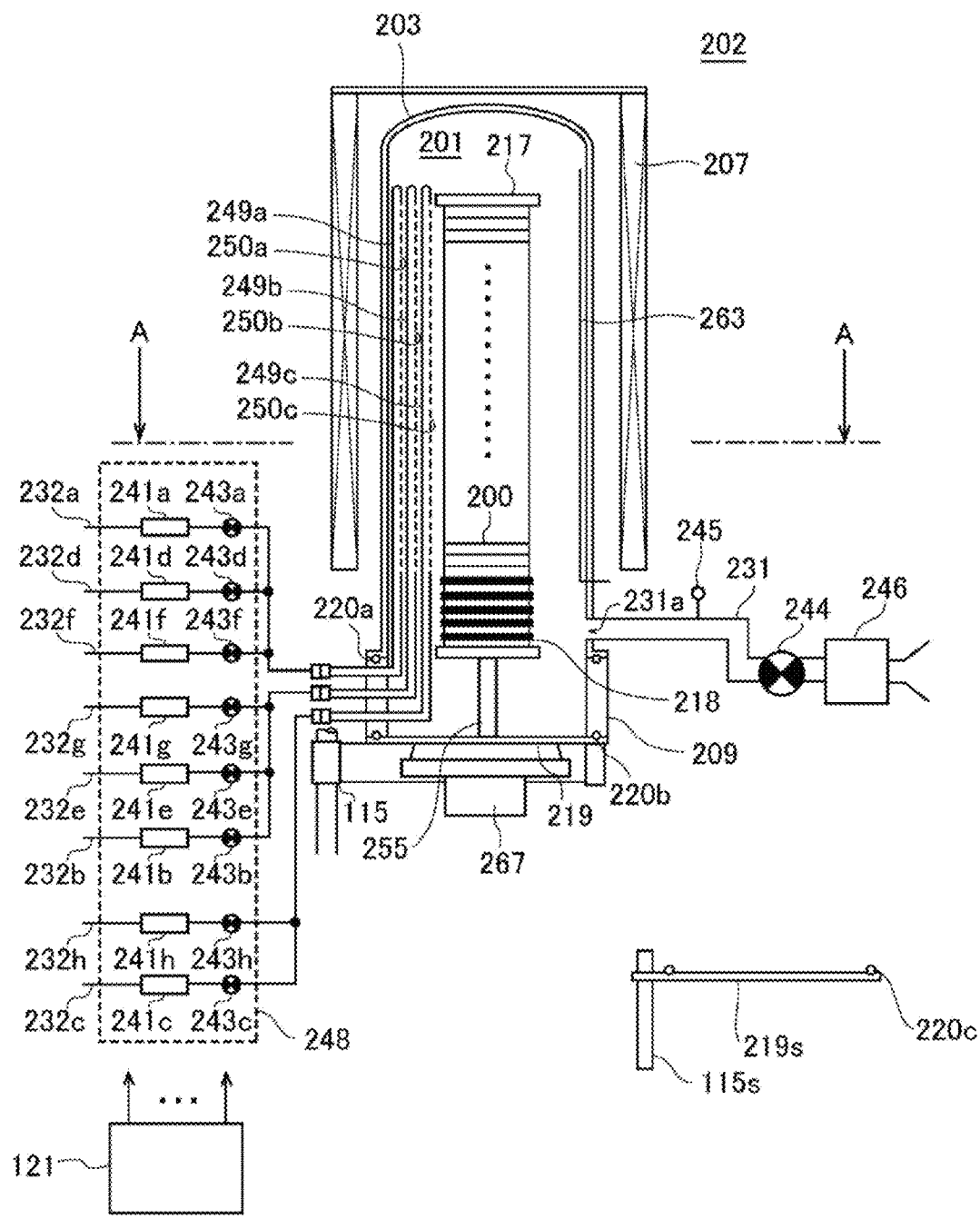
FIG. 1 is a schematic configuration view of a vertical process furnace of a substrate processing apparatus suitably used in an embodiment of the present disclosure, in which a portion of the process furnace 202 is shown in a vertical cross section.

As shown in FIG. 1, a process furnace 202 includes a heater 207 as a temperature adjustor (a heating part). The heater 207 has a cylindrical shape and is supported by a support plate so as to be vertically installed. The heater 207 also functions as an activation mechanism (an excitation part) configured to thermally activate (excite) a gas.

A reaction tube 203 is disposed inside the heater 207 to be concentric with the heater 207. The reaction tube 203 is made of, for example, a heat resistant material such as quartz ($SiO_2$) or silicon carbide (SiC), and has a cylindrical shape with its upper end closed and its lower end opened. A manifold 209 is disposed to be concentric with the reaction tube 203 under the reaction tube 203. The manifold 209 is made of, for example, a metal material such as stainless steel (SUS), and has a cylindrical shape with both of its upper and lower ends opened. The upper end portion of the manifold 209 engages with the lower end portion of the reaction tube 203 so as to support the reaction tube 203. An O-ring 220a serving as a seal is provided between the manifold 209 and the reaction tube 203. Similar to the heater 207, the reaction tube 203 is vertically installed. A process container (reaction container) mainly includes the reaction tube 203 and the manifold 209. A process chamber 201 is formed in a hollow cylindrical portion of the process container. The process chamber 201 is configured to accommodate a plurality of wafers 200 as substrates. Processing on the wafers 200 is performed in the process chamber 201.

Nozzles 249a to 249c as first to third supply parts are provided in the process chamber 201 so as to penetrate through a sidewall of the manifold 209. The nozzles 249a to 249c are also referred to as first to third nozzles, respectively. The nozzles 249a to 249c are made of, for example, a heat resistant material such as quartz or SiC. Gas supply pipes 232a to 232c are connected to the nozzles 249a to 249c, respectively. The nozzles 249a to 249c are different nozzles, and each of the nozzles 249a and 249c is provided adjacent to the nozzle 249b.

Mass flow controllers (MFCs) 241a to 241c, which are flow rate controllers (flow rate control parts), and valves 243a to 243c, which are opening/closing valves, are provided in the gas supply pipes 232a to 232c, respectively, sequentially from the upstream side of a gas flow. Each of gas supply pipes 232d and 232f is connected to the gas supply pipe 232a at the downstream side of the valves 243a. Each of gas supply pipes 232e and 232g is connected to the gas supply pipe 232b at the downstream side of the valves 243b. A gas supply pipe 232h is connected to the gas supply pipe 232c at the downstream side of the valves 243c. MFCs 241d to 241h and valves 243d to 243h are provided in the gas supply pipes 232d to 232h, respectively, sequentially from the upstream side of a gas flow. The gas supply pipes 232a to 232h are made of, for example, a metal material such as SUS.

Figure 2:
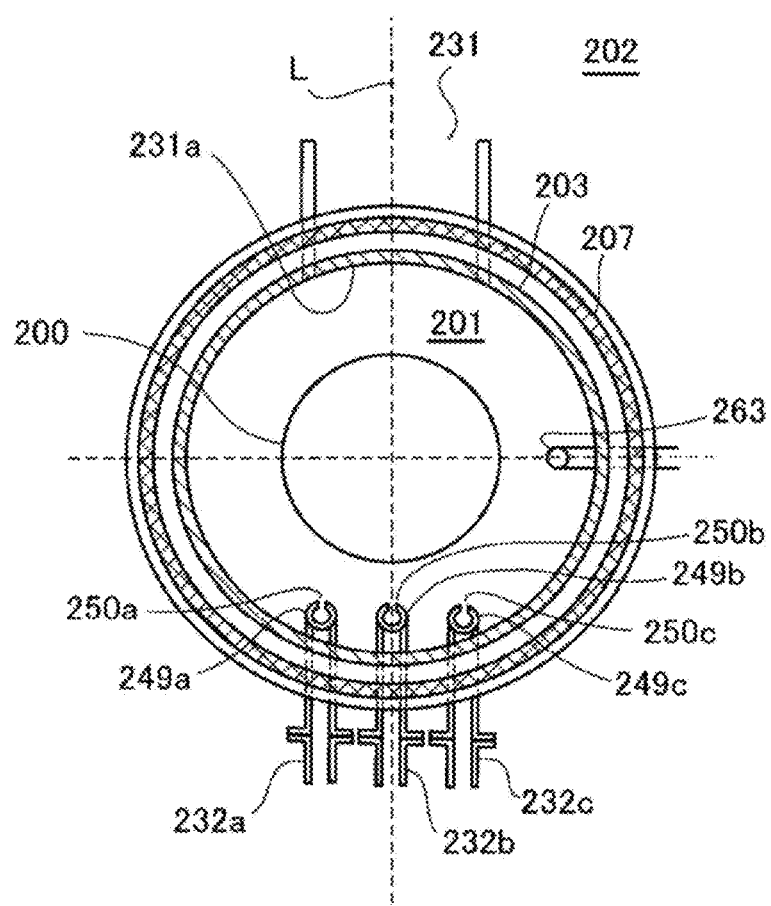
FIG. 2 is a schematic configuration view of the vertical process furnace of the substrate processing apparatus suitably used in the embodiment of the present disclosure, in which a portion of the process furnace 202 is shown in a cross section taken along line A-A in FIG. 1.

As shown in FIG. 2, each of the nozzles 249a to 249c is provided in an annular space (in a plan view) between an inner wall of the reaction tube 203 and the wafers 200 so as to extend upward from a lower portion of the inner wall of the reaction tube 203 to an upper portion thereof, that is, along an arrangement direction of the wafers 200. Specifically, each of the nozzles 249a to 249c is provided in a region horizontally surrounding a wafer arrangement region in which the wafers 200 are arranged at a lateral side of the wafer arrangement region, along the wafer arrangement region. In a plan view, the nozzle 249b is disposed so as to face an exhaust port 231a to be described later in a straight line with the centers of the wafers 200 loaded into the process chamber 201, which are interposed therebetween. The nozzles 249a and 249c are arranged so as to sandwich a straight line L passing through the nozzle 249b and the center of the exhaust port 231a from both sides along the inner wall of the reaction tube 203 (the outer peripheral portion of the wafers 200). The straight line L is also a straight line passing through the nozzle 249b and the centers of the wafers 200. That is, it can be said that the nozzle 249c is provided on the side opposite to the nozzle 249a with the straight line L interposed therebetween. The nozzles 249a and 249c are arranged in line symmetry with the straight line L as the axis of symmetry. Gas supply holes 250a to 250c for supplying a gas are formed on the side surfaces of the nozzles 249a to 249c, respectively. Each of the gas supply holes 250a to 250c is opened so as to oppose (face) the exhaust port 231a in a plan view, which enables a gas to be supplied toward the wafers 200. A plurality of gas supply holes 250a to 250c are formed from the lower portion of the reaction tube 203 to the upper portion thereof.

A precursor (precursor gas) is supplied from the gas supply pipe 232a into the process chamber 201 via the MFC 241a, the valve 243a, and the nozzle 249a.

A raw material (raw material gas), which is one of film-forming materials (film-forming gases), is supplied from the gas supply pipe 232b into the process chamber 201 via the MFC 241b, the valve 243b, and the nozzle 249b.

A reactant (reaction gas), which is one of film-forming materials (film-forming gases) and is also one of reaction materials, is supplied from the gas supply pipe 232c into the process chamber 201 via the MFC 241c, the valve 243c, and the nozzle 249c.

A catalyst (catalyst gas), which is one of film-forming materials (film-forming gases) and is also one of reaction materials, is supplied from the gas supply pipe 232d into the process chamber 201 via the MFC 241d, the valve 243d, the gas supply pipe 232a, and the nozzle 249a.

An etchant (etching gas) is supplied from the gas supply pipe 232e into the process chamber 201 via the MFC 241e, the valve 243e, the gas supply pipe 232b, and the nozzle 249b.

An inert gas is supplied from the gas supply pipes 232f to 232h into the process chamber 201 via the MFCs 241f to 241h, the valves 243f to 243h, the gas supply pipes 232a to 232c, and the nozzles 249a to 249c, respectively. The inert gas acts as a purge gas, a carrier gas, a dilution gas, or the like.

A precursor supply system mainly includes the gas supply pipe 232a, the MFC 241a, and the valve 243a. A raw material supply system mainly includes the gas supply pipe 232*b*, the MFC 241*b*, and the valve 243*b*. A reactant supply system mainly includes the gas supply pipe 232*c*, the MFC 241*c*, and the valve 243*c*. A catalyst supply system mainly includes the gas supply pipe 232*d*, the MFC 241*d*, and the valve 243*d*. An etchant supply system mainly includes the gas supply pipe 232*e*, the MFC 241*e*, and the valve 243*e*. An inert gas supply system mainly includes the gas supply pipes 232*f* to 232*h*, the MFCs 241*f* to 241*h*, and the valves 243*f* to 243*h*. Each or both of the raw material supply system and the reactant supply system are also referred to as a film-forming material supply system. Each or all of the raw material supply system, the reactant supply system, and the catalyst supply system are also referred to as a film-forming material supply system. Each or both of the reactant supply system and the catalyst supply system are also referred to as a reaction material supply system.

One or all of the above-described various supply systems may be configured as an integrated-type supply system 248 in which the valves 243*a* to 243*h*, the MFCs 241*a* to 241*h*, and so on are integrated. The integrated-type supply system 248 is connected to each of the gas supply pipes 232*a* to 232*h*. In addition, the integrated-type supply system 248 is configured such that operations of supplying various materials (various gases) into the gas supply pipes 232*a* to 232*h* (that is, the opening/closing operation of the valves 243*a* to 243*h*, the flow rate adjustment operation by the MFCs 241*a* to 241*h*, and the like) are controlled by a controller 121 which will be described later. The integrated-type supply system 248 is configured as an integral type or detachable-type integrated unit, and may be attached to and detached from the gas supply pipes 232*a* to 232*h* and the like on an integrated unit basis, so that the maintenance, replacement, extension, etc. of the integrated-type supply system 248 can be performed on an integrated unit basis.

The exhaust port 231*a* for exhausting an internal atmosphere of the process chamber 201 is provided below a sidewall of the reaction tube 203. As shown in FIG. 2, in a plan view, the exhaust port 231*a* is provided at a position opposing (facing) the nozzles 249*a* to 249*c* (the gas supply holes 250*a* to 250*c*) with the wafers 200 interposed therebetween. The exhaust port 231*a* may be provided from a lower portion of the sidewall of the reaction tube 203 to an upper portion thereof, that is, along the wafer arrangement region. An exhaust pipe 231 is connected to the exhaust port 231*a*. A vacuum exhaust device, for example, a vacuum pump 246, is connected to the exhaust pipe 231 via a pressure sensor 245, which is a pressure detector (pressure detection part) for detecting the internal pressure of the process chamber 201, and an auto pressure controller (APC) valve 244, which is a pressure regulator (pressure adjustment part). The APC valve 244 is configured to perform or stop a vacuum exhausting operation in the process chamber 201 by opening/closing the valve while the vacuum pump 246 is actuated, and is also configured to adjust the internal pressure of the process chamber 201 by adjusting an opening degree of the valve based on pressure information detected by the pressure sensor 245 while the vacuum pump 246 is actuated. An exhaust system mainly includes the exhaust pipe 231, the APC valve 244, and the pressure sensor 245. The exhaust system may include the vacuum pump 246.

A seal cap 219, which serves as a furnace opening cover configured to hermetically seal a lower end opening of the manifold 209, is provided under the manifold 209. The seal cap 219 is made of, for example, a metal material such as SUS, and is formed in a disc shape. An O-ring 220*b*, which is a seal making contact with the lower end of the manifold 209, is provided on an upper surface of the seal cap 219. A rotation mechanism 267 configured to rotate a boat 217, which will be described later, is installed under the seal cap 219. A rotary shaft 255 of the rotation mechanism 267 is connected to the boat 217 through the seal cap 219. The rotation mechanism 267 is configured to rotate the wafers 200 by rotating the boat 217. The seal cap 219 is configured to be vertically moved up and down by a boat elevator 115 which is an elevating mechanism installed outside the reaction tube 203. The boat elevator 115 is configured as a transfer device (transfer mechanism) which loads/unloads (transfers) the wafers 200 into/out of the process chamber 201 by moving the seal cap 219 up and down.

A shutter 219*s*, which serves as a furnace opening cover configured to hermetically seal a lower end opening of the manifold 209 in a state where the seal cap 219 is lowered and the boat 217 is unloaded from the process chamber 201, is provided under the manifold 209. The shutter 219*s* is made of, for example, a metal material such as SUS, and is formed in a disc shape. An O-ring 220*c*, which is a seal making contact with the lower end of the manifold 209, is provided on an upper surface of the shutter 219*s*. The opening/closing operation (such as elevation operation, rotation operation, or the like) of the shutter 219*s* is controlled by a shutter opening/closing mechanism 115*s*.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 to be spaced apart from each other. The boat 217 is made of a heat resistant material such as quartz or SiC. Heat insulating plates 218 made of a heat resistant material such as quartz or SiC are installed below the boat 217 in multiple stages.

A temperature sensor 263 serving as a temperature detector is installed in the reaction tube 203. Based on temperature information detected by the temperature sensor 263, a state of supplying electric power to the heater 207 is adjusted such that an interior of the process chamber 201 has a desired temperature distribution. The temperature sensor 263 is provided along the inner wall of the reaction tube 203.

Figure 3:
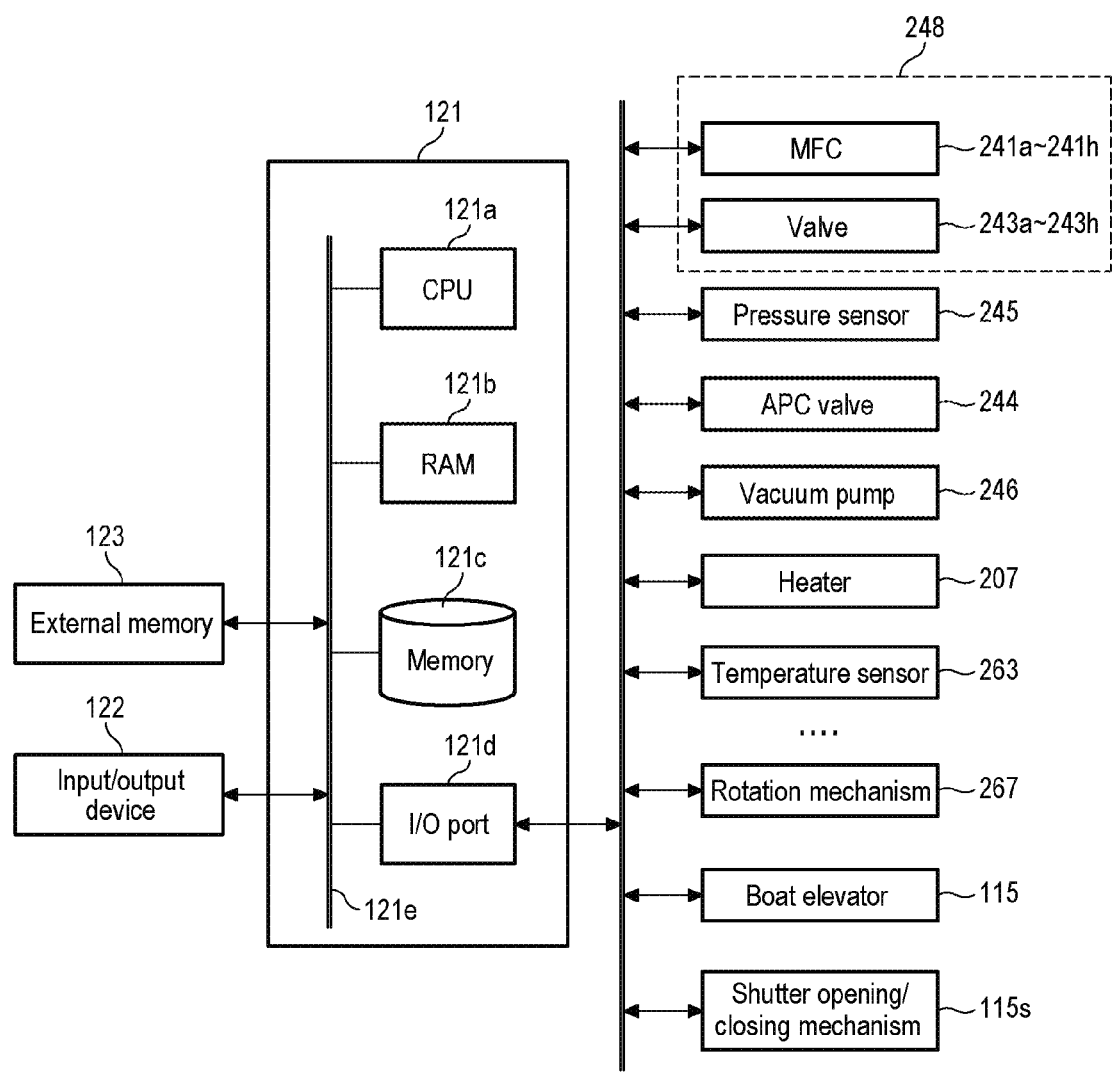
FIG. 3 is a schematic configuration diagram of a controller 121 of the substrate processing apparatus suitably used in the embodiment of the present disclosure, in which a control system of the controller 121 is shown in a block diagram.

As shown in FIG. 3, a controller 121, which is a control part (control means), is configured as a computer including a central processing unit (CPU) 121*a*, a random access memory (RAM) 121*b*, a memory 121*c*, and an I/O port 121*d*. The RAM 121*b*, the memory 121*c*, and the I/O port 121*d* are configured to be capable of exchanging data with the CPU 121*a* via an internal bus 121*e*. An input/output device 122 formed of, e.g., a touch panel or the like, is connected to the controller 121. Further, an external memory 123 can be connected to the controller 121.

The memory 121*c* is configured by, for example, a flash memory, a hard disk drive (HDD), or the like. A control program for controlling operations of a substrate processing apparatus, a process recipe in which sequences and conditions of substrate processing to be described later are written, etc. are readably stored in the memory 121*c*. The process recipe functions as a program for causing the controller 121 to execute each sequence in the substrate processing, which will be described later, to obtain an expected result. Hereinafter, the process recipe and the control program may be generally and simply referred to as a "program." Furthermore, the process recipe may be simply referred to as a "recipe." When the term "program" is used herein, it may indicate a case of including the recipe only, a case of including the control program only, or a case of including both the recipe and the control program. The RAM 121b is configured as a memory area (work area) in which programs or data read by the CPU 121a are temporarily stored.

The I/O port 121d is connected to the MFCs 241a to 241h, the valves 243a to 243h, the pressure sensor 245, the APC valve 244, the vacuum pump 246, the temperature sensor 263, the heater 207, the rotation mechanism 267, the boat elevator 115, the shutter opening/closing mechanism 115s, and so on.

The CPU 121a is configured to read and execute the control program from the memory 121c. The CPU 121a is also configured to read the recipe from the memory 121c according to an input of an operation command from the input/output device 122. In addition, the CPU 121a is configured to control the flow rate adjusting operation of various kinds of materials (gases) by the MFCs 241a to 241h, the opening/closing operation of the valves 243a to 243h, the opening/closing operation of the APC valve 244, the pressure adjusting operation performed by the APC valve 244 based on the pressure sensor 245, the actuating and stopping operation of the vacuum pump 246, the temperature adjusting operation performed by the heater 207 based on the temperature sensor 263, the operation of rotating the boat 217 with the rotation mechanism 267 and adjusting the rotation speed of the boat 217, the operation of moving the boat 217 up and down by the boat elevator 115, the opening/closing operation of the shutter 219s by the shutter opening/closing mechanism 115s, and so on, according to contents of the read recipe.

The controller 121 may be configured by installing, on the computer, the aforementioned program stored in the external memory 123. Examples of the external memory 123 may include a magnetic disk such as a HDD, an optical disc such as a CD, a magneto-optical disc such as a MO, a semiconductor memory such as a USB memory or a SSD, and the like. The memory 121c or the external memory 123 is configured as a non-transitory computer-readable recording medium. Hereinafter, the memory 121c and the external memory 123 may be generally and simply referred to as a "recording medium." When the term "recording medium" is used herein, it may indicate a case of including the memory 121c only, a case of including the external memory 123 only, or a case of including both the memory 121c and the external memory 123. Furthermore, the program may be provided to the computer using communication means such as the Internet or a dedicated line, instead of using the external memory 123.

(2) Substrate Processing Process

As a process of manufacturing a semiconductor device using the above-described substrate processing apparatus, a processing sequence example of forming a film in an inside of a concave portion formed on a surface of a wafer 200 as a substrate so as to bury the inside of the concave portion will be described mainly with reference to FIGS. 4 and 5A to 5D. In the following descriptions, the operations of the respective parts constituting the substrate processing apparatus are controlled by the controller 121.

Figure 5A:
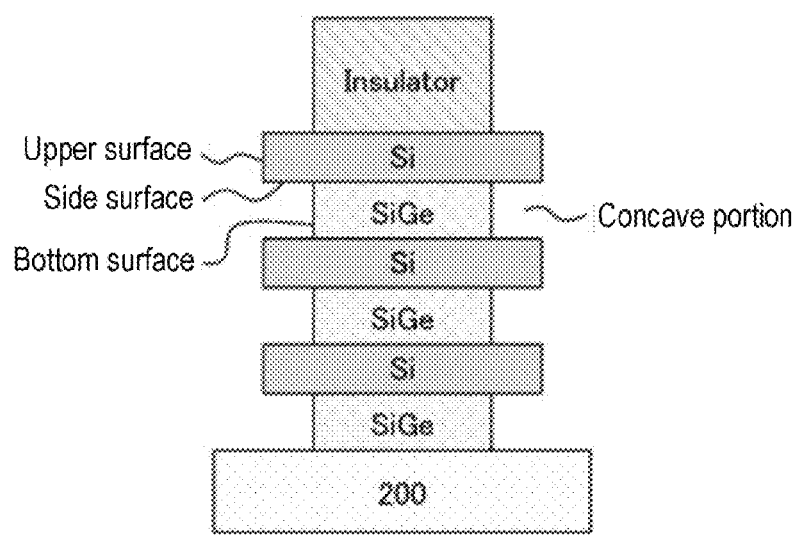
FIG. 5A is a partially-enlarged cross-sectional view of the surface of a substrate having its surface provided with a stacked structure in which a second material (SiGe) and a first material (Si) are alternately stacked, an insulating film being provided on the stacked structure, and a concave portion being provided in a sidewall of the stacked structure by partially removing a portion composed of the second material (SiGe) of the sidewall of the stacked structure, whose depth direction is a direction (horizontal direction) parallel to the surface of the substrate.

As shown in FIG. 5A, the concave portion having its upper surface and side surface composed of a first material containing a first element and its bottom surface composed of a second element different from the first element, whose depth direction is a direction (horizontal direction) parallel to the surface of the wafer 200, is provided on the surface of the wafer 200. FIG. 5A shows an example where the first element is silicon (Si), the second element is germanium (Ge), the first material is silicon (Si), and the second material is silicon germanium (SiGe). That is, in this example, the second material contains the second element in addition to the first element. Further, the wafer 200 is made of single crystal Si. That is, the wafer 200 contains the first element.

More specifically, a stacked structure in which the second material (SiGe) and the first material (Si) are alternately stacked is provided on the surface of the wafer 200, and an insulating film (insulator) is provided on the stacked structure. That is, a stacked structure in which the silicon germanium (SiGe) film and the silicon (Si) film are alternately stacked is provided on the surface of the wafer 200, and the insulating film (insulator) is provided on the stacked structure. By partially removing a portion of a sidewall of the stacked structure of the SiGe film and the Si film, which is composed of the SiGe film, the concave portion having its upper surface and side surface composed of the first material (Si) and its bottom surface composed of the second material (SiGe), whose depth direction is a direction (horizontal direction) parallel to the surface of the wafer 200, is provided on the sidewall of the stacked structure. In the present disclosure, as shown in FIG. 5A, a portion of the concave portion composed of the second material (SiGe) is referred to as a bottom surface, a portion of the concave portion composed of the first material (Si), which is in contact with the bottom surface and is provided perpendicular to the bottom surface, is referred to as a side surface with respect to the bottom surface, and a portion of the concave portion composed of the first material (Si), which is not in contact with the bottom surface and is provided parallel to the bottom surface, is referred to as a top surface with respect to the bottom surface.

Figure 4:
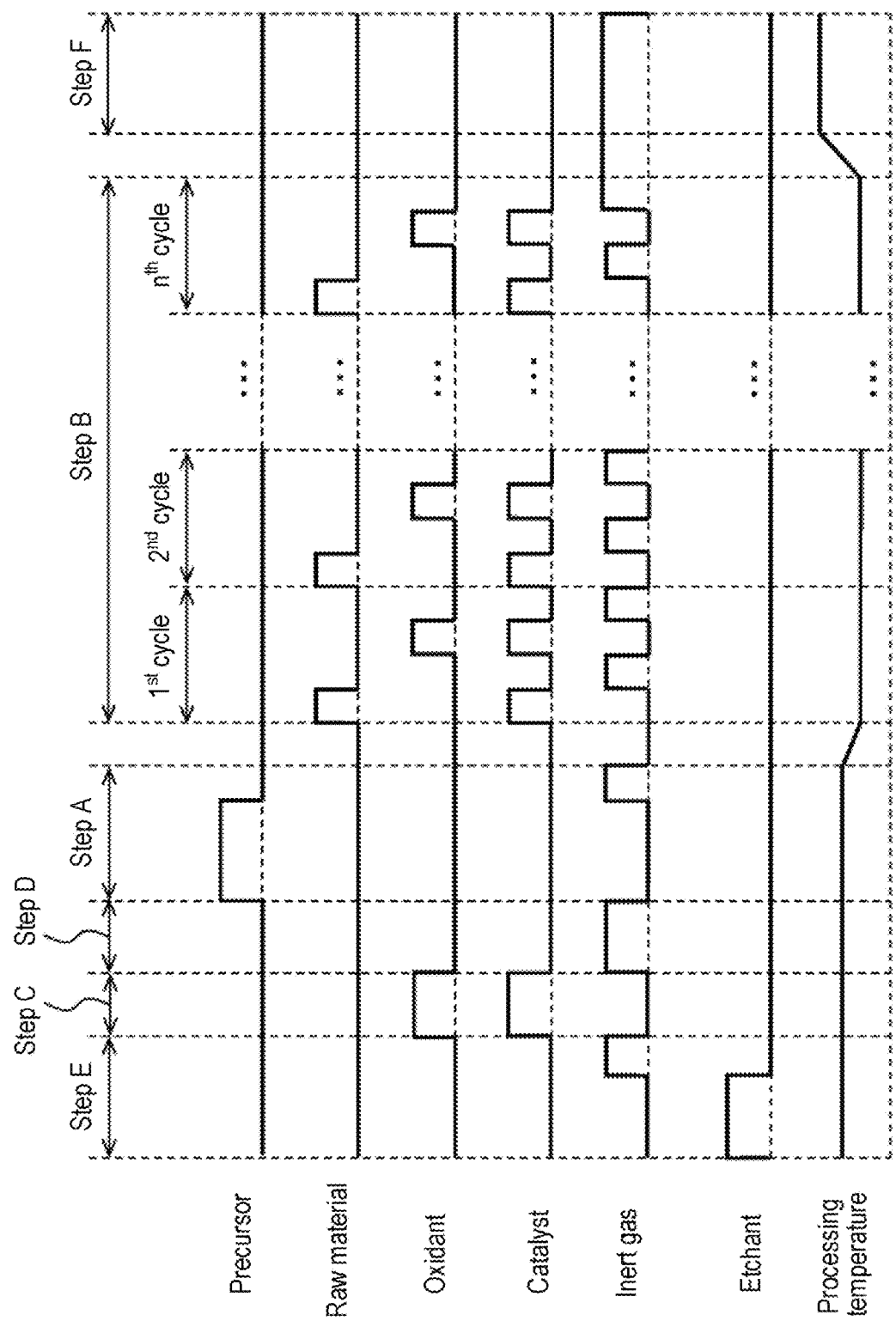
FIG. 4 is a diagram showing a processing sequence according to an embodiment of the present disclosure.

A processing sequence shown in FIG. 4 includes:
step A of forming a film formation suppression layer on a surface of a first material of a concave portion of a wafer 200, by supplying a precursor to the wafer 200 provided with the concave portion on a surface of the wafer 200 to adsorb at least a portion of a molecular structure of molecules constituting the precursor on the surface of the first material of the concave portion, the concave portion having a top surface and a side surface composed of the first material containing a first element and a bottom surface composed of a second material containing a second element different from the first element; and
step B of growing a film on a surface of the second material of the concave portion supplying a film-forming material to the wafer 200 having the film formation suppression layer formed on the surface of the first material.

As shown in FIG. 4, step B includes:
performing a cycle a predetermined number of times, the cycle including non-simultaneously performing:
step B1 of supplying a raw material as the film-forming material to the wafer 200; and step B2 of supplying an oxidant, which is a reactant, as the film-forming material to the wafer 200.

As a result, the film is grown starting from the bottom surface of the concave portion, the film is grown bottom-up in the concave portion, and the inside of the concave portion is buried by the film.

At this time, in at least one selected from the group of step B1 and step B2, as the film-forming material, a catalyst may be further supplied to the wafer 200. FIG. 4 shows an example in which the catalyst is further supplied as the film-forming material to the wafer 200 in each of step B1 and step B2.

In addition, the processing sequence shown in FIG. 4 further includes: step C of forming a hydroxyl group termination on the surface of the first material before performing step A, by supplying an oxidant as a reaction material to the wafer 200 to oxidize the surface of the first material. At this time, a hydroxyl group termination is formed on the surface of the second material as the surface of the second material is oxidized.

In addition, the processing sequence shown in FIG. 4 further includes: step D of removing the hydroxyl group termination formed on the surface of the second material after performing step C and before performing step A, by heating an annealing (hereinafter, also referred to as ANL) the wafer 200 to sublimate an oxide formed on the surface of the second material. At this time, the hydroxyl group termination formed on the surface of the second material is removed while retaining the hydroxyl group termination formed on the surface of the first material. As a result, the hydroxyl group termination is formed on the surface of the first material before performing step A, and the hydroxyl group termination is not formed on the surface of the second material before performing step A or a much smaller amount of hydroxyl group termination is formed on the surface of the second material than the amount of hydroxyl group termination on the surface of the first material. Hereinafter, the hydroxyl group termination is also referred to as an OH termination.

In addition, the processing sequence shown in FIG. 4 further includes: step E of removing a native oxide film on the surfaces of the first material and the second material before performing step C, by supplying an etchant to the wafer 200.

In addition, the processing sequence shown in FIG. 4 further includes: step F of performing post-treatment (PT) on the film formed so as to bury the inside of the concave portion after performing step B, by heating and heat-treating the wafer 200.

In the present embodiment, an example in which the first element is Si, the second element is Ge, the first material is Si, and the second material is SiGe, and in step B, as a film, a silicon oxycarbide film (SiOC film), which is one of films containing oxygen (O) and carbon (C), or a silicon oxide film (SiOC film), which is one of films containing silicon (Si) and oxygen (O), is grown will be described.

In the present disclosure, for the sake of convenience, the above-described processing sequence may be denoted as follows. The same denotation may be used in modifications and other embodiments to be described later.

Etchant→Oxidant→ANL→Precursor→(Raw material+Catalyst→Oxidant+Catalyst)×n→PT

When the term "wafer" is used in the present disclosure, it may refer to "a wafer itself" or "a wafer and a stacked body of certain layers or films formed on a surface of the wafer." When the phrase "a surface of a wafer" is used in the present disclosure, it may refer to "a surface of a wafer itself" or "a surface of a certain layer formed on a wafer." When the expression "a certain layer is formed on a wafer" is used in the present disclosure, it may mean that "a certain layer is formed directly on a surface of a wafer itself" or that "a certain layer is formed on a layer formed on a wafer." When the term "substrate" is used in the present disclosure, it may be synonymous with the term "wafer."

(Wafer Charging and Boat Loading)

After the boat 217 is charged with a plurality of wafers 200 (wafer charging), the shutter 219s is moved by the shutter opening/closing mechanism 115s and a lower end opening of the manifold 209 is opened (shutter open). Thereafter, as shown in FIG. 1, the boat 217 charged with the plurality of wafers 200 is lifted up by the boat elevator 115 to be loaded into the process chamber 201 (boat loading). In this state, the seal cap 219 seals the lower end of the manifold 209 through the O-ring 220b.

(Pressure Adjustment and Temperature Adjustment)

The interior of the process chamber 201, that is, a space where the wafers 200 are placed, is vacuum-exhausted (decompression-exhausted) by the vacuum pump 246 to reach a desired pressure (degree of vacuum). At this time, the internal pressure of the process chamber 201 is measured by the pressure sensor 245, and the APC valve 244 is feedback-controlled based on the measured pressure information. Further, the wafers 200 in the process chamber 201 are heated by the heater 207 so as to have a desired temperature. At this time, the state of supplying electric power to the heater 207 is feedback-controlled based on the temperature information detected by the temperature sensor 263 so that the interior of the process chamber 201 has a desired temperature distribution. Further, the rotation of the wafers 200 by the rotation mechanism 267 is started. The exhaust of the interior of the process chamber 201 and the heating and rotation of the wafers 200 are continuously performed at least until the processing on the wafers 200 is completed.

(Step E: Native Oxide Film Removal)

After that, an etchant is supplied to the wafer 200.

Specifically, the valve 243e is opened to allow the etchant (etching gas) to flow into the gas supply pipe 232e. The flow rate of the etchant is adjusted by the MFC 241e, and the etchant is supplied into the process chamber 201 via the gas supply pipe 232b and the nozzle 249b and is exhausted through the exhaust port 231a. In this operation, the etchant is supplied to the wafer 200 from the side of the wafer 200 (etchant supply). At this time, the valves 243f to 243h may be opened to allow an inert gas to be supplied into the process chamber 201 via the nozzles 249a to 249c, respectively.

By supplying the etchant to the wafer 200 under the process conditions to be described later, the native oxide film formed on the surface of the wafer 200 can be removed. That is, the native oxide film on the surfaces of the first material and the second material on the surface of the wafer 200 can be removed. Specifically, it is possible to remove the native oxide film on the surface of the concave portion having the upper surface and the side surface provided on the surface of the wafer 200, which are composed of the first material (Si), and the bottom surface composed of the second material (SiGe), whose depth direction is a direction (horizontal direction) parallel to the surface of the wafer 200.

After removing the native oxide film formed on the surface of the wafer 200, the valve 243e is closed to stop the supply of the etchant into the process chamber 201. Then, the interior of the process chamber 201 is vacuum-exhausted to remove a gaseous substance and the like remaining in the process chamber 201 from the interior of the process chamber 201. At this time, the valves 243f to 243h are opened to allow an inert gas to be supplied into the process chamber 201 via the nozzles 249a to 249c, respectively. The inert gas supplied from the nozzles 249a to 249c acts as a purge gas, whereby the interior of the process chamber 201 is purged (purging).

The process conditions for supplying the etchant are exemplified as follows.

Processing temperature: room temperature (25 degrees C.) to 200 degrees C., specifically 50 to 150 degrees C.

Processing pressure: 10 to 13,332 Pa, specifically 20 to 1,333 Pa

Etchant supply flow rate: 0.5 to 5 slm, specifically 0.5 to 2 slm

Etchant supply time: 1 to 120 minutes, specifically 1 to 60 minutes

Inert gas supply flow rate (for each gas supply pipe): 0 to 20 slm

The process conditions for purging are exemplified as follows.

Processing temperature: room temperature (25 degrees C.) to 500 degrees C.

Processing pressure: 1 to 30 Pa

Inert gas supply flow rate (for each gas supply pipe): 0.5 to 20 slm

Inert gas supply time: 1 to 120 seconds, specifically 1 to 60 seconds

In the present disclosure, the notation of a numerical range such as "25 to 200 degrees C." means that the lower limit value and the upper limit value are included in the range. Therefore, for example, "25 to 200 degrees C." means "25 degrees C. or higher and 00 degrees C. or lower." The same applies to other numerical ranges. The processing temperature means the temperature of the wafer 200 or the internal temperature of the process chamber 201, and the processing pressure means the internal pressure of the process chamber 201. Further, the gas supply flow rate of 0 slm means a case where the gas is not supplied. These apply equally to the following description.

As the etchant, for example, a fluorine (F)-containing gas can be used. As the F-containing gas, for example, a hydrogen fluoride (HF) gas, a fluorine ($F_2$) gas, or the like can be used. In addition to these gases, for example, a HF aqueous solution or the like can also be used as the etchant. That is, the etchant may be a gaseous substance or a liquefied substance. Further, the etchant may be a liquefied substance such as a mist-like substance. As the etchant, one or more of these gases can be used.

As the inert gas, a nitrogen ($N_2$) gas or a rare gas such as an argon (Ar) gas, a helium (He) gas, a neon (Ne) gas, or a xenon (Xe) gas can be used. This point is the same in each step to be described later. As the inert gas, one or more of these gases can be used.

(Step C: Oxidation)

After that, an oxidant (oxidizing gas) is supplied as a reaction material to the wafer 200.

Specifically, the valve 243c is opened to allow the oxidant, which is one of reactants, as the reaction material, to flow into the gas supply pipe 232c. The flow rate of the oxidant is adjusted by the MFC 241c, and the oxidant is supplied into the process chamber 201 via the nozzle 249c and is exhausted through the exhaust port 231a. In this operation, the oxidant is supplied to the wafer 200 from the side of the wafer 200 (oxidant supply). At this time, the valve 243d may be opened to allow a catalyst to flow into the gas supply pipe 232d. In this case, the flow rate of the catalyst is adjusted by the MFC 241d, and the catalyst is supplied into the process chamber 201 via the gas supply pipe 232a and the nozzle 249a, is mixed with the oxidant in the process chamber 201, and is exhausted through the exhaust port 231a. At this time, a mixture (mixed gas) of the catalyst and the oxidant is supplied to the wafer 200 from the side of the wafer 200. Further, at this time, the valves 243f to 243h may be opened to allow an inert gas to be supplied into the process chamber 201 via the nozzles 249a to 249c, respectively.

By supplying the oxidant or the mixture of the oxidant and the catalyst to the wafer 200 under the process conditions to be described later, the surface of the first material (Si) on the surface of the wafer 200 after the native oxide film is removed can be oxidized to form an OH termination on the surface of the first material (Si). An oxide film (oxide) such as a silicon oxide film (SiO film) is formed on the surface of the first material (Si), and the OH termination is formed on the surface of the oxide film. Further, by supplying the mixture of the oxidant and the catalyst to the wafer 200, the oxidation rate can be increased under a low temperature. However, when it is necessary to reduce the oxidation rate, or when the oxidation rate is adjusted by the temperature, the supply of the catalyst may be omitted.

At this time, the surface of the second material (SiGe) on the surface of the wafer 200 is also oxidized to form an OH termination on the surface of the second material (SiGe). An oxide film (oxide) such as a germanium oxide film (GeO film) or a silicon germanium oxide film (SiGeO film) is formed on the surface of the second material (SiGe), and the OH termination is formed on the surface of the oxide film.

After forming the OH termination on the surface of the first material (Si) on the surface of the wafer 200, the valve 243d is closed to stop the supply of the oxidant into the process chamber 201. At this time, if the catalyst is being supplied at the same time, the valve 243d is closed to also stop the supply of the catalyst into the process chamber 201. Then, a gaseous substances and the like remaining in the process chamber 201 are removed from the process chamber 201 (purging) according to the same processing procedure and process conditions as in the purging in step E.

The process conditions for supplying the oxidant are exemplified as follows.

Processing temperature: room temperature (25 degrees C.) to 500 degrees C., specifically room temperature to 300 degrees C.

Processing pressure: 1 to 101,325 Pa, specifically 1 to 13,332 Pa

Oxidant supply flow rate: 0.1 to 10 slm, specifically 0.5 to 5 slm

Oxidant supply time: 1 to 120 minutes, specifically 1 to 60 minutes

Catalyst supply flow rate: 0 to 10,000 sccm

Inert gas supply flow rate (for each gas supply pipe): 0 to 20 slm

As the oxidant, for example, an oxygen (O)-containing gas or an oxygen (O) and hydrogen (H)-containing gas can be used. Examples of the O-containing gas may include an oxygen ($O_2$) gas, an ozone ($O_3$) gas, a nitrous oxide ($N_2O$) gas, a nitric oxide (NO) gas, a nitrogen dioxide ($NO_2$) gas, a carbon monoxide (CO) gas, a carbon dioxide ($CO_2$) gas, and the like. Examples of the O- and H-containing gas may include water vapor ($H_2O$ gas), a hydrogen peroxide ($H_2O_2$), a hydrogen ($H_2$) gas+oxygen ($O_2$) gas, a $H_2$ gas+ozone ($O_3$) gas, and the like. The O- and H-containing gas is also an O-containing gas. In addition to these gases, as the oxidant, a cleaning liquid containing, for example, ammonia water, hydrogen peroxide water, and pure water may be used. That is, the oxidation may be performed by APM cleaning. In this case, the wafer 200 can be oxidized by exposing it to the cleaning liquid. In this way, the oxidant may be a gaseous substance or a liquefied substance. Further, the oxidant may be a liquefied substance such as a mist-like substance. As the oxidant, one or more of these gases and substances can be used.

As the catalyst, for example, an amine-based gas containing carbon (C), nitrogen (N), and hydrogen (H) can be used. Examples of the amine-based gas may include a cyclic amine-based gas such as a pyridine ($C_5H_5N$) gas, an aminopyridine ($C_5H_6N_2$) gas, a picoline ($C_6H_7N$) gas, a rutidine ($C_7H_9N$) gas, a piperazine ($C_4H_{10}N_2$) gas, or a piperidine ($C_5H_{11}N$) gas, a chain amine-based gas such as a triethylamine (($C_2H_5)_3N$, abbreviation: TEA) gas or a diethylamine (($C_2H_5)_2NH$, abbreviation: DEA) gas, or the like. This point is the same in step B to be described later.

(Step D: ANL)

After forming the OH termination on the surface of the first material (Si), purging of the interior of the process chamber 201 is performed as described above. In parallel with this purging, the wafer 200 is heated and annealed. As described above, since the heating of the wafer 200 is continuously performed at least until the processing on the wafer 200 is completed, the annealing is started when the supply of the oxidant or the catalyst is stopped.

By annealing the wafer 200 under the process conditions to be described later, the oxide such as GeO formed on the surface of the second material (SiGe) can be sublimated, whereby the OH termination formed on the surface of the second material (SiGe) can be removed.

At this time, not only the second material (SiGe) but also the first material (Si) is heated in the same manner, but since the oxide film such as a SiO film formed on the surface of the first material (Si) has a strong Si—O bond, it does not sublimate under the process conditions to be described later. That is, even when the annealing is performed, the OH termination formed on the surface of the first material (Si) can be maintained (held) without being removed.

In this way, in the annealing process in step D, it is possible to remove the oxide such as GeO formed on the surface of the second material (SiGe) while retaining (maintaining) the oxide film such as the SiO film formed on the surface of the first material (Si). That is, in the annealing process in step D, it is possible to remove the OH termination formed on the surface of the second material (SiGe) while retaining (maintaining) the OH termination formed on the surface of the first material (Si). In some cases, not all of OH terminations formed on the surface of the second material (SiGe) are removed, and only a small part thereof remains.

As a result, the surface of the first material (Si) before performing step A is in a state where the OH termination is formed on the surface of the first material (Si). Further, the surface of the second material (SiGe) before performing step A is in a state where no OH termination is formed on the surface of the second material (SiGe) or in a state where a much smaller amount of OH termination than the amount of OH termination on the surface of the first material (Si) is formed on the surface of the second material (SiGe). That is, the amount (density or concentration) of OH termination on the surface of the first material (Si) before performing step A is larger (higher) than the amount (density or concentration) of OH termination on the surface of the second material (SiGe).

The process conditions for annealing (ANL) are exemplified as follows.

Processing temperature: 100 to 500 degrees C., specifically 100 to 300 degrees C.
Processing pressure: 1 to 13,332 Pa, specifically 1 to 1,333 Pa
Inert gas supply flow rate (for each gas supply pipe): 0 to 20 slm
Annealing time: 1 to 120 minutes, specifically 1 to 60 minutes (Step A: Film Formation Suppression Layer Formation)

After that, a precursor is supplied to the wafer 200.

Specifically, the valve 243a is opened to allow the precursor to flow into the gas supply pipe 232a. The flow rate of the precursor is adjusted by the MFC 241a, and the precursor is supplied into the process chamber 201 via the nozzle 249a and is exhausted through the exhaust port 231a. In this operation, the precursor is supplied to the wafer 200 from the side of the wafer 200 (precursor supply). At this time, the valves 243f to 243h may be opened to allow an inert gas to be supplied into the process chamber 201 via the nozzles 249a to 249c, respectively.

By supplying the precursor to the wafer 200 under the process conditions to be described later, it is possible to selectively (preferentially) adsorb at least a portion of the molecular structure of molecules constituting the precursor on the surface of the first material (Si) of the first material (Si) and the second material (SiGe) of the concave portion on the surface of the wafer 200, thereby selectively (preferentially) forming a film formation suppression layer on the surface of the first material (Si). Specifically, it is possible to selectively adsorb at least a portion of the molecular structure of molecules constituting the precursor on the surface of the first material (Si) by reacting an OH group, which terminates the surface of the first material (Si), with the precursor while suppressing adsorption of at least a portion of the molecular structure of molecules constituting the precursor on the surface of the second material (SiGe). This makes it possible to terminate the surface of the first material (Si) with at least a portion of the molecular structure of molecules constituting the precursor. As at least the portion of the molecular structure of molecules constituting the precursor, for example, a trialkylsilyl group such as a trimethylsilyl group (Si-Me$_3$) or a triethylsilyl group (Si-Et$_3$) can be exemplified. In these cases, Si of the trimethylsilyl group or the triethylsilyl group is adsorbed on the surface of the first material (Si), so that the outermost surface of the first material (Si) is terminated by an alkyl group such as a methyl group or an ethyl group. At least a portion of the molecular structure of molecules constituting the precursor terminating the surface of the first material (Si), for example, an alkyl group (alkylsilyl group) such as a methyl group (trimethylsilyl group) or an ethyl group (triethylsilyl group), prevents the adsorption of a raw material on the surface of the first material (Si) in a film forming process (selective growth), which will be described later, to act as a film formation inhibition layer (film formation suppression layer), that is, an inhibitor, that inhibits the progress of a film-forming reaction on the surface of the first material (Si).

Further, in this step, at least a portion of the molecular structure of molecules constituting the precursor may be adsorbed on a portion of the surface of the second material (SiGe), but the amount of adsorption thereof on the surface of the second material (SiGe) is small and the amount of adsorption thereof on the surface of the first material (Si) is overwhelmingly large. Such selective (preferential) adsorption is possible because the process conditions in this step are conditions in which the precursor does not undergo gas phase decomposition in the process chamber 201. This is also possible because the surface of the first material (Si) is OH-terminated over the entire region, whereas many regions of the surface of the second material (SiGe) are not OH-terminated. In this step, since the precursor does not undergo gas phase decomposition in the process chamber 201, at least a portion of the molecular structure of molecules constituting the precursor is not multi-deposited on the surface of the first material (Si) and the surface of the second material (SiGe), and at least a portion of the molecular structure of molecules constituting the precursor is selectively adsorbed on the surface of the first material (Si), whereby the surface of the first material (Si) is selectively terminated by at least the portion of the molecular structure of molecules constituting the precursor.

After selectively forming the film formation suppression layer on the surface of the first material (Si), the valve 243a is closed to stop the supply of the precursor into the process chamber 201. Then, a gaseous substances and the like remaining in the process chamber 201 are removed from the process chamber 201 (purging) according to the same processing procedure and process conditions as in the purging in step E.

The process conditions for supplying the precursor are exemplified as follows.

Processing temperature: room temperature (25 degrees C.) to 500 degrees C., specifically room temperature to 250 degrees C.

Processing pressure: 5 to 1,000 Pa

Precursor supply flow rate: 1 to 3,000 sccm, specifically 1 to 500 sccm

Precursor supply time: 1 second to 120 minutes, specifically 30 seconds to 60 minutes Inert gas supply flow rate (for each gas supply pipe): 0 to 20 slm As the precursor, for example, a material containing one or more atoms to which a first functional group and a second functional group are directly bonded can be used. The first functional group in the precursor is preferably a functional group capable of chemically adsorbing the precursor to an adsorption site (for example, an OH termination) on the surface of the first material (Si). The first functional group preferably contains an amino group, and preferably contains a substituted amino group. When the precursor contains the amino group (preferably the substituted amino group), the amount of chemical adsorption of the precursor on the surface of the first material (Si) can be increased. In particular, from the viewpoint of the adsorptivity on the surface of the first material (Si), it is preferable that all the first functional groups of the precursor are substituted amino groups.

As a substituent contained in the substituted amino group, an alkyl group is preferable, an alkyl group having 1 to 5 carbon atoms is more preferable, and an alkyl group having 1 to 4 carbon atoms is particularly preferable. The alkyl group contained in the substituted amino group may be linear or branched. Examples of the alkyl group contained in the substituted amino group may include a methyl group, an ethyl group, an n-propyl group, an n-butyl group, an iso-propyl group, an isobutyl group, a sec-butyl group, a tert-butyl group, and the like. The number of substituents contained in the substituted amino group is 1 or 2, but it is preferably 2. When the number of substituents contained in the substituted amino group is 2, the two substituents may be the same or different.

The number of first functional groups in the precursor is preferably 2 or less, more preferably 1. When the precursor has a plurality of first functional groups, they may be the same or different.

The second functional group in the precursor is preferably a functional group capable of modifying the outermost surface of the first material (Si) into a film formation inhibition region. The second functional group is preferably a chemically stable functional group, more preferably a hydrocarbon group. The hydrocarbon group may be an aliphatic hydrocarbon group such as an alkyl group, an alkenyl group, or an alkynyl group, or may be an aromatic hydrocarbon group. Of these, the alkyl group is preferable as the hydrocarbon group. In particular, from the viewpoint of high chemical stability, it is preferable that all the second functional groups of the precursor are alkyl groups.

The alkyl group as the second functional group is more preferably an alkyl group having 1 to 5 carbon atoms, particularly preferably an alkyl group having 1 to 4 carbon atoms. The alkyl group contained in the substituted amino group may be linear or branched. Examples of the alkyl group contained in the substituted amino group may include a methyl group, an ethyl group, an n-propyl group, an n-butyl group, an isopropyl group, an isobutyl group, a sec-butyl group, a tert-butyl group, and the like.

The number of second functional groups in the precursor may be an integer of 1 or more. When the number of first functional groups in the precursor is 1, the number of second functional groups in the precursor is preferably 3. Further, when the number of first functional groups in the precursor is 2, the number of second functional groups in the precursor is preferably 2. The plurality of second functional groups contained in the precursor may be the same or different.

In the precursor, examples of the atom to which the first functional group and the second functional group are directly bonded may include a carbon (C) atom, a silicon (Si) atom, a germanium (Ge) atom, and a tetravalent metal atom. Here, examples of the tetravalent metal atom may include a titanium (Ti) atom, a zirconium (Zr) atom, a hafnium (Hf) atom, a molybdenum (Mo) atom, a tungsten (W) atom, and the like. Further, the atom to which the first functional group and the second functional group are directly bonded may be a metal atom that can be bonded to four or more ligands, in addition to the tetravalent metal atom. In this case, the number of second functional groups can be increased, so that a strong effect as an inhibitor can be exhibited.

Among these, the C atom, the Si atom, and the Ge atom are preferable as the atom to which the first functional group and the second functional group are directly bonded. This is because when any of the C atom, the Si atom, and the Ge atom is used as the atom to which the first functional group and the second functional group are directly bonded, at least one selected from the group of the high adsorptivity of the precursor on the surface of the first material (Si) and the high chemical stability of the precursor after the adsorption on the surface of the first material (Si), that is, residues derived from the precursor, can be obtained. Among these, the Si atom is more preferable as the atom to which the first functional group and the second functional group are directly bonded. This is because when the Si atom is used as the atom to which the first functional group and the second functional group are directly bonded, both of the high adsorptivity of the precursor on the surface of the first material (Si) and the high chemical stability of the precursor after the adsorption on the surface of the first material (Si), that is, residues derived from the precursor, can be obtained. As described above, the first functional group and the second functional group are directly bonded to the atom to which the first functional group and the second functional group are directly bonded, but in addition to these, a hydrogen (H) atom or a third functional group may be bonded thereto.

The third functional group bonded to the atom to which the first functional group and the second functional group are directly bonded may be any functional group other than the above-mentioned functional groups as the first functional group and the second functional group. Examples of the third functional group may include functional groups formed by appropriately combining two or more of a C atom, a Si atom, a Ge atom, a tetravalent metal atom, a metal atom capable of being bonded to four or more ligands, an O atom, a nitrogen (N) atom, and an H atom.

The precursor contains one or more atoms to which the first functional group and the second functional group are directly bonded, but may contain two or more atoms to which the first functional group and the second functional group are directly bonded. Hereinafter, the atom to which the first functional group and the second functional group are directly bonded is also referred to as an atom X for the sake of convenience.

The precursor preferably has a structure containing a tetravalent atom to which the first functional group and the second functional group are directly bonded. Above all, it is more preferable that the precursor has a structure containing a tetravalent atom to which only the first functional group and the second functional group are directly bonded. Above all, it is particularly preferable that the precursor has a structure containing one Si to which only the first functional group and the second functional group are directly bonded. That is, it is particularly preferable that the precursor has a structure in which only the first functional group and the second functional group are directly bonded to Si as the center atom.

The precursor preferably has a structure containing one amino group in one molecule. Above all, it is more preferable that the precursor has a structure containing one amino group and at least one alkyl group in one molecule. Above all, it is more preferable that the precursor has a structure containing one amino group and three alkyl groups in one molecule. Further, the precursor preferably has a structure in which one amino group is bonded to Si which is the center atom. Above all, it is more preferable that the precursor has a structure in which one amino group and at least one alkyl group are bonded to Si which is the center atom. Above all, it is more preferable that the precursor has a structure in which one amino group and three alkyl groups are bonded to Si which is the center atom. As described above, the amino group is preferably a substituted amino group. The substituents contained in the substituted amino group are as described above.

As the precursor, for example, it is preferable to use a compound represented by the following chemical formula (1).

$$[R^1]n^1\text{—}(X)\text{—}[R^2]m^1 \qquad \text{Chemical Formula (1):}$$
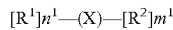

In the chemical formula (1), $R^1$ represents a first functional group that is directly bonded to X, $R^2$ represents a second functional group or a H atom that is directly bonded to X, X represents a tetravalent atom selected from the group consisting of a C atom, a Si atom, a Ge atom, and a tetravalent metal atom, $n^1$ represents 1 or 2, and $m^1$ represents 2 or 3.

The first functional group represented by $R^1$ has the same meaning as the above-mentioned first functional group, and the same applies to preferred examples. When $n^1$ is 2, two $R^1$s may be the same or different. The second functional group represented by $R^2$ has the same meaning as the above-mentioned second functional group, and the same applies to preferred examples. When $m^1$ is 2 or 3, two or three $R^2$s may have one or two H atoms and the rest may be second functional groups, or all may be second functional groups. When all of the two or three $R^2$s are second functional groups, all the second functional groups may be the same or different. The Si atom is preferable as the tetravalent atom represented by X. 1 is preferable as $n^2$. 3 is preferable as $m^2$.

Examples of the precursor may include (dimethylamino)trimethylsilane (($CH_3$)$_2$NSi($CH_3$)$_3$, abbreviation: DMATMS), (diethylamino)triethylsilane (($C_2H_5$)$_2$NSi($C_2H_5$)$_3$, abbreviation: DEATES), (dimethylamino)triethylsilane (($CH_3$)$_2$NSi($C_2H_5$)$_3$, abbreviation: DMATES), (diethylamino)trimethylsilane (($C_2H_5$)$_2$NSi($CH_3$)$_3$, abbreviation: DEATMS), (trimethylsilyl)amine (($CH_3$)$_3$SiNH$_2$, abbreviation: TMSA), (triethylsilyl)amine (($C_2H_5$)$_3$SiNH$_2$, abbreviation: TESA), (dimethylamino)silane (($CH_3$)$_2$NSiH$_3$, abbreviation: DMAS), (diethylamino)silane (($C_2H_5$)$_2$NSiH$_3$, abbreviation: DEAS), and the like.

Further, examples of the precursor may include bis(dimethylamino)dimethylsilane ([($CH_3$)$_2$N]$_2$Si($CH_3$)$_2$, abbreviation: BDMADMS), bis(diethylamino)diethylsilane ([($C_2H_5$)$_2$N]$_2$Si($C_2H_5$)$_2$, abbreviation: BDEADES), bis(dimethylamino)diethylsilane ([($CH_3$)$_2$N]$_2$Si($C_2H_5$)$_2$, abbreviation: BDMADES), bis(diethylamino)dimethylsilane ([($C_2H_5$)$_2$N]$_2$Si($CH_3$)$_2$, abbreviation: BDEADMS), bis(dimethylamino)silane ([($CH_3$)$_2$N]$_2$SiH$_2$, abbreviation: BDMAS), bis(dimethylaminodimethylsilyl)ethane ([($CH_3$)$_2$N($CH_3$)$_2$Si]$_2$C$_2$H$_6$, abbreviation: BDMADMSE), bis(dipropylamino)silane ([($C_3H_7$)$_2$N]$_2$SiH$_2$, abbreviation: BDPAS), bis(dipropylamino)dimethylsilane ([($C_3H_7$)$_2$N]$_2$Si($CH_3$)$_2$, abbreviation: BDPADMS), bis(dipropylamino)diethylsilane (($C_3H_7$)$_2$N]$_2$Si($C_2H_5$)$_2$, abbreviation: BDPADES), (dimethylsilyl)diamine (($CH_3$)$_2$Si(NH$_2$)$_2$, abbreviation: DMSDA), (diethylsilyl)diamine (($C_2H_5$)$_2$Si(NH$_2$)$_2$, abbreviation: DESDA), (dipropylsilyl)diamine (($C_3H_7$)$_2$Si(NH$_2$)$_2$, abbreviation: DPSDA), bis(dimethylaminodimethylsilyl)methane ([($CH_3$)$_2$N($CH_3$)$_2$Si]$_2$CH$_2$, abbreviation: BDMADM SM), bis(dimethylamino)tetramethyldisilane ([($CH_3$)$_2$N]$_2$($CH_3$)$_4$Si$_2$, abbreviation: BDMATMDS), and the like.

All of them are organic compounds having a structure in which an amino group and an alkyl group are directly bonded to Si. These compounds may also be referred to as an aminoalkyl compound or an alkylamino compound. The precursor may be a gaseous substance or a liquefied substance. Further, the precursor may be a liquefied substance such as a mist-like substance.

One or more of these substances can be used as the precursor.

(Step B: Film forming process (Selective Growth))

After that, the next steps B1 and B2 are sequentially executed. In these steps, the output of the heater 207 is adjusted to maintain the temperature of the wafer 200 at a temperature equal to or lower than the temperature of the wafer 200 in step A, preferably at a temperature lower than the temperature of the wafer 200 in step A.

[Step B1]

In this step, a raw material (raw material gas) and a catalyst (catalyst gas) are supplied as a film-forming material to the wafer 200 after the film formation suppression layer is selectively formed on the wafer 200 in the process chamber 201, that is, the surface of the first material (Si).

Specifically, the valves 243b and 243d are opened to allow the raw material to flow into the gas supply pipe 232b and the catalyst to flow into the gas supply pipe 232d. The flow rates of the raw material and the catalyst are adjusted by the MFCs 241b and 241d, respectively, and the raw material and the catalyst are supplied into the process chamber 201 via the nozzles 249b and 249a, respectively, are mixed in the process chamber 201, and are exhausted through the exhaust port 231a. In this operation, the raw material and the catalyst are supplied to the wafer 200 (raw material+catalyst supply). At this time, the valves 243f to 243h may be opened to allow an inert gas to be supplied into the process chamber 201 via the nozzles 249a to 249c, respectively.

By supplying the raw material and the catalyst to the wafer 200 under the process conditions to be described later, it is possible to selectively (preferentially) chemically adsorbing at least a portion of the molecular structure of molecules constituting the raw material on the surface of the second material (SiGe) while suppressing chemical adsorption of at least a portion of the molecular structure of molecules constituting the raw material on the surface of the first material (Si). As a result, a first layer is selectively (preferentially) formed on the surface of the second material (SiGe). The first layer contains at least a portion of the molecular structure of molecules constituting the raw material. That is, the first layer contains at least some of atoms constituting the raw material.

In this step, by supplying the catalyst together with the raw material, it is possible to proceed with the above-mentioned reaction in a non-plasma atmosphere and under low temperature conditions as will be described later. In this way, by forming the first layer in the non-plasma atmosphere and under the low temperature conditions as will be described later, it is possible to maintain molecules and atoms constituting the film formation suppression layer formed on the surface of the first material (Si) without extinguishing (desorbing) them from the surface of the first material (Si).

Further, by forming the first layer in the non-plasma atmosphere and under the low temperature conditions as will be described later, since the raw material can be prevented from being thermally decomposed (gas phase-decomposed), that is, self-decomposed, in the process chamber 201, it is possible to prevent multiple deposition of at least a portion of the molecular structure of molecules constituting the raw material on the surfaces of the first material (Si) and the second material (SiGe) and selectively adsorb the raw material on the surface of the second material (SiGe).

After selectively forming the first layer on the surface of the second material (SiGe), the valves 243b and 243d are closed to stop the supply of the raw material and the catalyst into the process chamber 201, respectively. Then, a gas and the like remaining in the process chamber 201 is removed from the process chamber 201 (purging) according to the same processing procedure and process conditions as in the purging in step E. The processing temperature for purging in this step is preferably the same as the processing temperature for supplying the raw material and the catalyst.

The process conditions for supplying the raw material+the catalyst are exemplified as follows.
  Processing temperature: room temperature (25 degrees C.) to 120 degrees C., specifically room temperature to 90 degrees C.
  Processing pressure: 133 to 1,333 Pa
  Raw material supply flow rate: 1 to 2,000 sccm
  Catalyst supply flow rate: 1 to 2,000 sccm
  Inert gas supply flow rate (for each gas supply pipe): 0 to 20,000 sccm
  Each gas supply time: 1 to 60 seconds In this step, when the first layer is formed, at least a portion of the molecular structure of molecule constituting the raw material may be adsorbed on a portion of the surface of the first material (Si), but the amount of adsorption thereof on the portion of the surface of the first material (Si) is very small, which is much smaller than the amount of adsorption of at least a portion of the molecular structure of molecules constituting the raw material on the surface of the second material (SiGe). Such selective (preferential) adsorption is possible because the process conditions in this step are the low temperature conditions as described above and the conditions that the raw material does not undergo gas phase decomposition in the process chamber 201. This is also possible because the film formation suppression layer is formed over the entire surface of the first material (Si), whereas the film formation suppression layer is not formed in many regions of the surface of the second material (SiGe).

An example of the raw material may include a Si- and halogen-containing gas. Halogen includes chlorine (Cl), fluorine (F), bromine (Br), iodine (I), and the like. The Si- and halogen-containing gas preferably contains halogen in the form of a chemical bond between Si and halogen. The Si- and halogen-containing gas may further contain C, in which case C is preferably contained in the form of a Si—C bond. An example of the Si- and halogen-containing gas may include a silane-based gas containing Si, Cl, and an alkylene group and having a Si—C bond, that is, an alkylenechlorosilane-based gas. The alkylene group includes a methylene group, an ethylene group, a propylene group, a butylene group, and the like. The alkylenechlorosilane-based gas preferably contains Cl in the form of a Si—Cl bond and C in the form of a Si—C bond.

Examples of the Si- and halogen-containing gas may include an alkylenechlorosilane-based gas such as a bis(trichlorosilyl)methane (($SiCl_3)_2CH_2$, abbreviation: BTCSM) gas or a 1,2-bis(trichlorosilyl)ethane (($SiCl_3)_2C_2H_4$, abbreviation: BTCSE) gas, an alkylchlorosilane-based gas such as a 1,1,2,2-tetrachloro-1,2-dimethyldisilane (($CH_3)_2Si_2Cl_4$, abbreviation: TCDMDS) gas or a 1,2-dichloro-1,1,2,2-tetramethyldisilane (($CH_3)_4Si_2Cl_2$, abbreviation: DCTMDS) gas, a gas having a cyclic structure composed of Si and C and containing halogen, such as a 1,1,3,3-tetrachloro-1,3-disilacyclobutane ($C_2H_4Cl_4Si_2$, abbreviation: TCDSCB) gas, and the like. Further, an example of the Si- and halogen-containing gas may include an inorganic chlorosilane-based gas such as a tetrachlorosilane ($SiCl_4$, abbreviation: STC) gas, a hexachlorodisilane ($Si_2Cl_6$, abbreviation: HCDS) gas, or an octachlorotrisilane ($Si_3Cl_8$, abbreviation: OCTS) gas. One or more of these gases can be used as the raw material. The raw material may be a gaseous substance or a liquefied substance. Further, the raw material may be a liquefied substance such as a mist-like substance.

Further, as the raw material, instead of the Si- and halogen-containing gas, it may be possible to use, e.g., an aminosilane-based gas such as a tetrakis(dimethylamino)silane ($Si[N(CH_3)_2]_4$, abbreviation: 4DMAS) gas, a tris(dimethylamino)silane ($Si[N(CH_3)_2]_3H$, abbreviation: 3DMAS) gas, a bis(diethylamino)silane ($Si[N(C_2H_5)_2]_2H_2$, abbreviation: BDEAS) gas, a bis(tert-butylamino)silane ($SiH_2[NH(C_4H_9)]_2$, abbreviation: BTBAS) gas, or a (diisopropylamino)silane ($SiH_3[N(C_3H_7)_2]$, abbreviation: DIPAS) gas.

Examples of the catalyst may include the same catalysts as the various catalysts exemplified in the above-described step C.

[Step B2]

After step B1 is completed, an oxidant (oxidizing gas) and a catalyst (catalyst gas) are supplied as film-forming materials to the wafer 200 in the process chamber 201, that is, the wafer 200 after the first layer is selectively formed on the surface of the second material (SiGe).

Specifically, the valves 243c and 243d are opened to allow the oxidant to flow into the gas supply pipe 232c and the catalyst to flow into the gas supply pipe 232d, respectively. The flow rates of the oxidant and the catalyst are adjusted by the MFCs 241c and 241d, respectively, and the oxidant and the catalyst are supplied into the process chamber 201 via the nozzles 249c and 249a, respectively, are mixed in the process chamber 201, and are exhausted through the exhaust port 231a. In this operation, the oxidant and the catalyst are supplied to the wafer 200 (oxidant+catalyst supply). At this time, the valves 243f to 243h may be opened to allow an inert gas to be supplied into the process chamber 201 via the nozzles 249a to 249c, respectively.

By supplying the oxidant and the catalyst to the wafer 200 under the process conditions to be described later, it is possible to oxidize at least a portion of the first layer formed on the surface of the second material (SiGe) in step B1. As a result, a second layer formed by oxidizing the first layer is formed on the surface of the second material (SiGe).

In this step, by supplying the catalyst together with the oxidant, it is possible to proceed with the above-mentioned reaction in a non-plasma atmosphere and under low temperature conditions as will be described later. In this way, by forming the second layer in the non-plasma atmosphere and under the low temperature conditions as will be described later, it is possible to maintain molecules and atoms constituting the film formation suppression layer formed on the surface of the first material (Si) without extinguishing (desorbing) them from the surface of the first material (Si).

After oxidizing (converting) the first layer formed on the surface of the second material (SiGe) into the second layer, the valves 243c and 243d are closed to stop the supply of the oxidant and the catalyst into the process chamber 201, respectively. Then, a gas and the like remaining in the process chamber 201 is removed from the process chamber 201 (purging) according to the same processing procedure and process conditions as in the purging in step E. The processing temperature for purging in this step is preferably the same as the processing temperature for supplying the oxidant and the catalyst.

The process conditions for supplying the oxidant+the catalyst are exemplified as follows.

Processing temperature: room temperature (25 degrees C.) to 120 degrees C., specifically room temperature to 100 degrees C.

Processing pressure: 133 to 1,333 Pa

Oxidant supply flow rate: 1 to 2,000 sccm

Catalyst supply flow rate: 1 to 2,000 sccm

Inert gas supply flow rate (for each gas supply pipe): 0 to 20,000 sccm

Each gas supply time: 1 to 60 seconds

Examples of the oxidant may include the same oxidants as the various oxidants exemplified in the above-described step C. Examples of the catalyst may include the same catalysts as the various catalysts exemplified in the above-described step C.

[Performing Predetermined Number of Times]

Figure 5B:
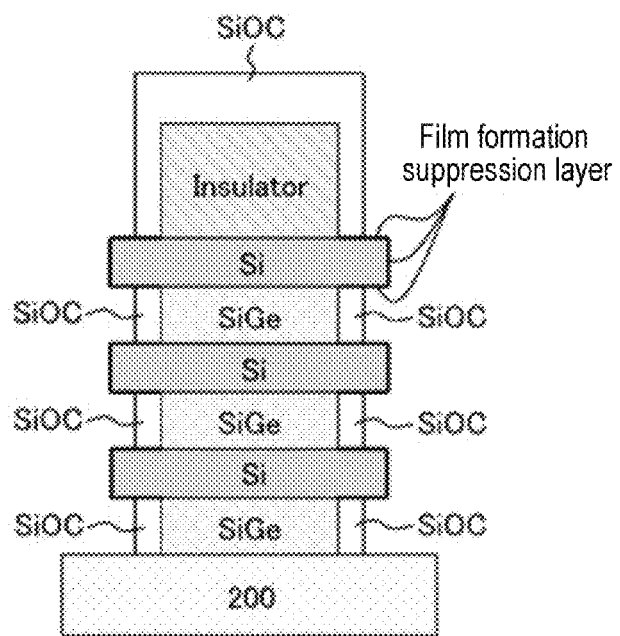
FIG. 5B is a partially-enlarged cross-sectional view of the surface of the substrate in the middle of performing a process of forming a silicon oxycarbide film (SiOC) on the substrate having the configuration shown in FIG. 5A on its surface by the processing sequence of the embodiment.

By performing a cycle a predetermined number of times (n time, where n is an integer of 1 or more), the cycle including non-simultaneously, that is, without synchronization, performing the above-described steps B1 and B2, a film can be selectively (preferentially) grown on the surface of the second material (SiGe) of the first material (Si) and the second material (SiGe) of the concave portion on the surface of the wafer 200, as shown in FIG. 5B. For example, when the above-mentioned raw materials oxidant, and catalyst are used, a SiOC film or a SiO film can be selectively grown as the film on the surface of the second material (SiGe). The above cycle may be repeated a plurality of times. That is, the thickness of the second layer formed per cycle may be set to be smaller than a desired film thickness, and the above cycle may be repeated multiple times until the thickness of a film formed by stacking second layers reaches the desired film thickness.

By repeating the above cycle a plurality of times, the film can be grown toward the opening side of the concave portion, starting from the surface of the second material (SiGe) constituting the bottom surface of the concave portion on the surface of the wafer 200. At this time, since the film formation suppression layer is formed on the surface of the first material (Si) constituting the upper surface and the side surface of the concave portion, the film growth starting from the surface of the first material (Si) can be suppressed. That is, by repeating the above cycle a plurality of times, it is possible to promote the film growth starting from the bottom surface of the concave portion while suppressing the film growth starting from the upper surface and the side surface of the concave portion. As a result, it is possible to grow bottom-up the film in the inside of the concave portion so that the inside of the concave portion can be buried with the film (SiOC), as shown in FIG. 5C.

Figure 5C:
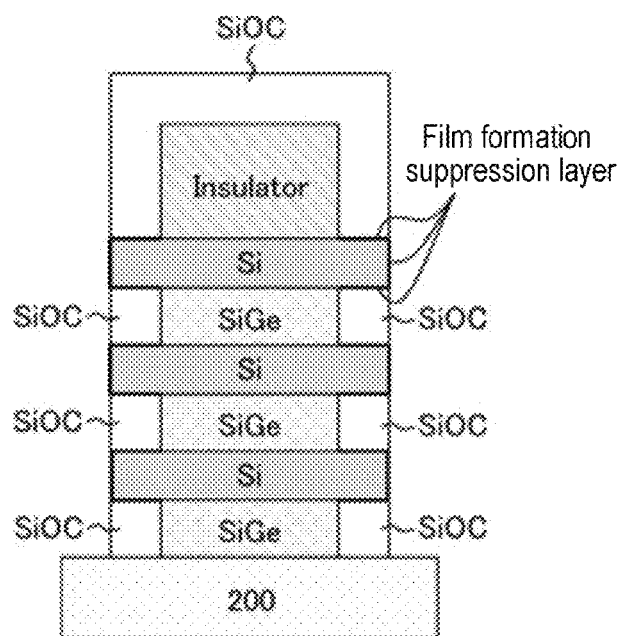
FIG. 5C is a partially-enlarged cross-sectional view of the surface of the substrate after performing the process of forming the silicon oxycarbide film (SiOC) on the substrate having the configuration shown in FIG. 5A on its surface by the processing sequence of the embodiment.

When steps B1 and B2 are performed, as shown in FIGS. 5B and 5C, since the film formation suppression layer formed on the surface of the first material (Si) is maintained on the surface of the first material (Si) as described above, it is possible to suppress the film growth starting from the surface of the first material (Si). However, when the formation of the film formation suppression layer on the surface of the first material (Si) is insufficient for some reason, the film growth starting from the surface of the first material (Si) may occur very slightly. However, even in this case, the thickness of the film formed starting from the surface of the first material (Si) is much smaller than the thickness of the film formed starting from the surface of the second material (SiGe). Therefore, even in that case, it is possible to properly bury the inside of the concave portion by the above-mentioned bottom-up growth.

(Step F: PT)

Figure 5D:
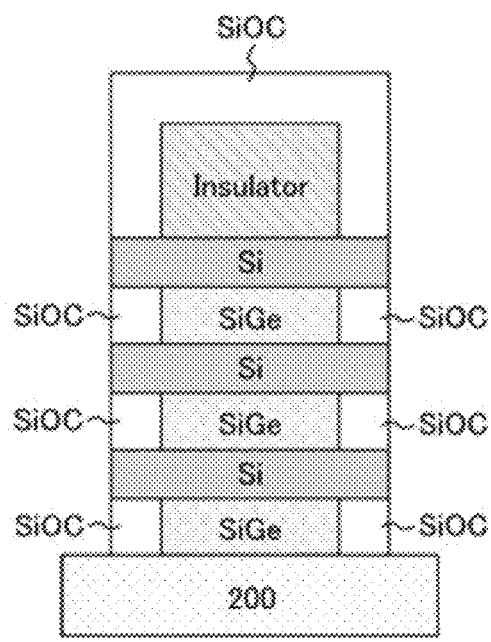
FIG. 5D is a partially-enlarged cross-sectional view of the surface of the substrate after performing the process of forming the silicon oxycarbide film (SiOC) on the substrate having the configuration shown in FIG. 5A on the surface, and then performing annealing by the processing sequence of the embodiment.

After the film forming process is completed, the wafer 200 is heated and heat-treated to perform post-treatment (PT) on the film formed so as to bury the inside of the concave portion. At this time, the output of the heater 207 is adjusted so as to make the internal temperature of the process chamber 201, that is, the temperature of the wafer 200 after the film is formed so as to bury the inside of the concave portion, equal to or higher than the temperature of the wafer 200 in steps A and B, preferably higher than the temperature of the wafer 200 in steps A and B. By performing PT, impurities contained in the film formed so as to bury the inside of the concave portion can be removed or defects contained in the film can be repaired. Further, as shown in FIG. 5D, residual groups or resides of the film formation suppression layer on the surface of the first material (Si), that is, the upper surface of the concave portion and the interface between the side surface of the concave portion and the film (SiOC), can be desorbed by PT. Further, this step may be performed in a state where an inert gas is supplied into the process chamber 201, or may be performed in a state where a reactive substance such as an oxidant (oxidizing gas) is supplied into the process chamber 201. When the reactive substance such as the oxidant is supplied, it is possible to enhance the effect of desorbing the residual groups or residues of the film formation suppression layer on the upper surface of the concave portion and the interface between the side surface of the concave portion and the film. The inert gas and the reactive substance such as and the oxidant (oxidizing gas) in this case are also referred to as an assist substance.

The process conditions for post-treatment (PT) are exemplified as follows.

Processing temperature: 120 to 1,000 degrees C., specifically 400 to 700 degrees C.
Processing pressure: 1 to 120,000 Pa
Processing time: 1 to 18,000 seconds
Assist substance supply flow rate: 0 to 50 slm (After-Purging and Returning to Atmospheric Pressure)

After the film forming process is ended and PT is completed, an inert gas acting as a purge gas is supplied into the process chamber 201 from each of the nozzles 249a to 249c and is exhausted through the exhaust port 231a. Thus, the interior of the process chamber 201 is purged and a gas, reaction by-products, and the like remaining in the process chamber 201 are removed from the interior of the process chamber 201 (after-purging). After that, the internal atmosphere of the process chamber 201 is substituted with an inert gas (inert gas substitution) and the internal pressure of the process chamber 201 is returned to the atmospheric pressure (returning to atmospheric pressure).

(Boat Unloading and Wafer Discharging)

After that, the seal cap 219 is moved down by the boat elevator 115 to open the lower end of the manifold 209. Then, the processed wafers 200 supported by the boat 217 are unloaded from the lower end of the manifold 209 to the outside of the reaction tube 203 (boat unloading). After the boat unloading, the shutter 219s is moved and the lower end opening of the manifold 209 is sealed by the shutter 219s via the O-ring 220c (shutter close). The processed wafers 200 are unloaded from the reaction tube 203 and are then discharged from the boat 217 (wafer discharging).

(3) Effects of the Present Embodiment

According to the present embodiment, one or more effects set forth below may be achieved.

(a) By performing step A of forming a film formation suppression layer on a surface of the first material (Si) of the concave portion on the surface of the wafer 200 by supplying the precursor to the wafer 200 and step B of growing a film on a surface of the second material (SiGe) of the concave portion by supplying the film-forming material to the wafer 200 in which the film formation suppression layer is formed on the surface of the first material, it is possible to promote the film growth starting from the bottom surface of the concave portion while suppressing the film growth starting from the upper surface and the side surface of the concave portion. As a result, it is possible to grow bottom-up the film in the concave portion so that the inside of the concave portion can be buried with the film without causing voids or seams in the film. That is, it is possible to form a void-free and seamless film in the concave portion, making it possible to improve the burial characteristics.

(b) By promoting the film growth starting from the bottom surface of the concave portion while suppressing the film growth starting from the upper surface and the side surface of the concave portion, it is possible to bury the inside of the concave portion with the film without the film growing on the upper surface of the concave portion. As a result, as shown in FIG. 5C, it is possible to create a state in which the film (SiOC) is not formed on the upper surface of the concave portion at the time when the film forming process is completed. That is, at the time when the film forming process is completed, the inside of the concave portion in the sidewall of the stacked structure in which the second material (SiGe) and the first material (Si) are alternately stacked on the surface of the wafer 200 can be buried with the film (SiOC) so that the sidewall of the stacked structure can be flattened. This makes it possible to omit a step of removing an extra film formed on the upper surface of the concave portion or the like by etching after the film forming process, which has been conventionally required.

Further, as described above, even though the film formation suppression layer is formed on the surface of the first material, the film growth starting from the surface of the first material may occur very slightly for some reason. In this case, a step of etching an extra film formed on the upper surface of the concave portion or the like may be required. However, even in that case, the extra film formed on the upper surface of the concave portion or the like is very small as described above, and accordingly, it is possible to significantly reduce the load in the step of etching the extra film and significantly shorten the time required for etching.

Figure 6A:
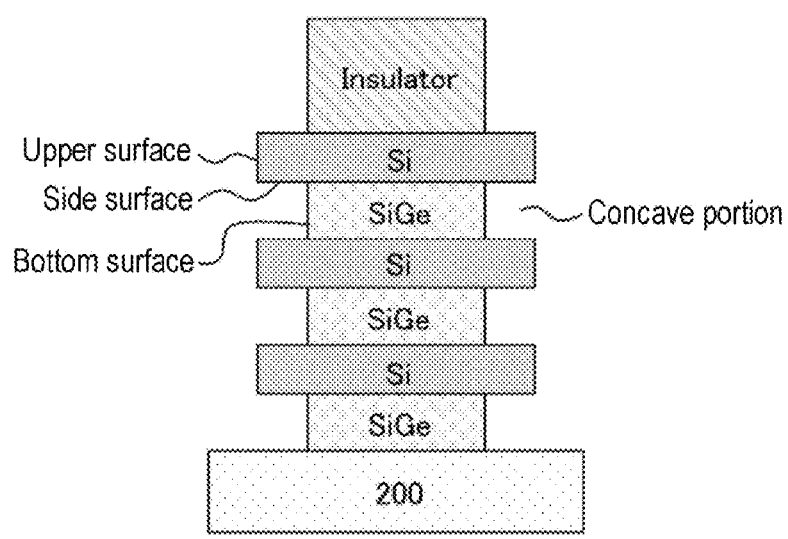
FIG. 6A is a partially-enlarged cross-sectional view of the surface of a substrate having its surface provided with a stacked structure in which a second material (SiGe) and a first material (Si) are alternately stacked, an insulating film being provided on the stacked structure, and a concave portion being provided in a sidewall of the stacked structure by partially removing a portion composed of the second material (SiGe) of the sidewall of the stacked structure, whose depth direction is a direction (horizontal direction) parallel to the surface of the substrate.
Figure 6B:
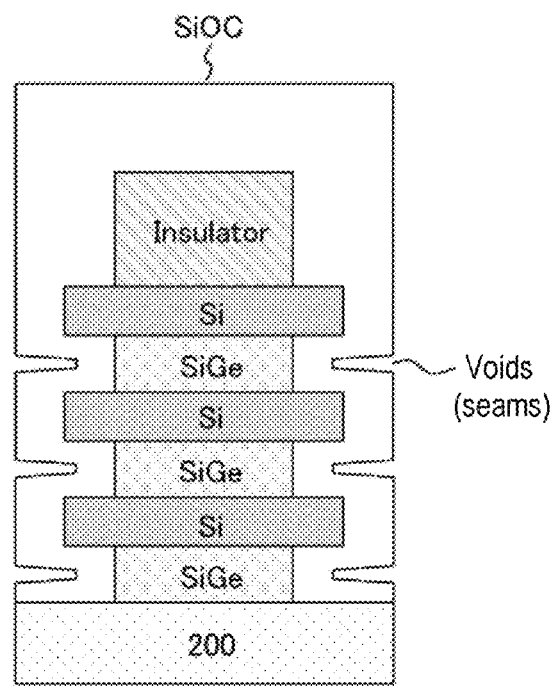
FIG. 6B is a partially-enlarged cross-sectional view of the surface of the substrate after performing a process of forming a silicon oxycarbide film (SiOC) on the substrate having the configuration shown in FIG. 6A on its surface by a conventional film forming method.
Figure 6C:
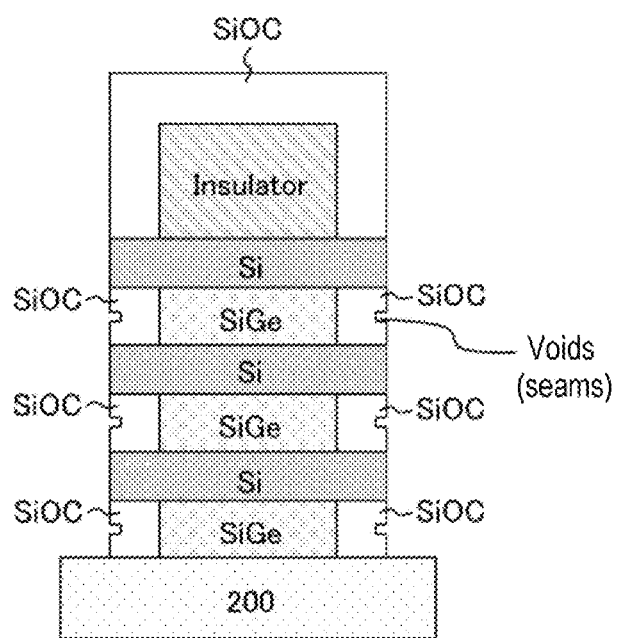
FIG. 6C is a partially-enlarged cross-sectional view of the surface of the substrate after removing an extra film formed on the upper surface of the concave portion or the like by performing an etching process on the substrate having the configuration shown in FIG. 6B on its surface.

On the other hand, when the inside of the concave portion is buried with a film such as a SiOC film by a conventional film forming method in which only step B is performed, as shown in FIG. 6B, the film (SiOC) is formed on the entire sidewall of the stacked structure in which the second material (SiGe) and the first material (Si) on the surface of the wafer 200 are alternately stacked. At that time, as shown in FIG. 6B, voids or seams (hereinafter, referred to as voids) may be formed in the formed film due to the shape of the concave portion. In this case, in order to bury the inside of the concave portion in the sidewall of the stacked structure in which the second material and the first material are alternately stacked, with the film and flatten the sidewall of the stacked structure, it is necessary to perform a step of etching an extra film formed on the upper surface of the concave portion or the like. For example, when the step of etching the extra film formed on the upper surface of the concave portion or the like is performed on a substrate having the configuration shown in FIG. 6B, as shown in FIG. 6C, it is possible to create a state in which no film is formed on the upper surface of the concave portion. However, in this case, as shown in FIG. 6C, the voids formed in the film during film formation are maintained, and in some cases, the voids become deeper due to etching such that the sidewall of the stacked structure in which the second material and the first material are alternately stacked cannot be flattened. Further, when the conventional film forming method is used, it is indispensable to perform the step of etching the extra film, which prolongs the total processing time and lowers the productivity.

In contrast, according to the present embodiment, it is possible to form a void-free and seamless film in the concave portion while suppressing the film growth on the upper surface of the concave portion, and further, at the time when the film forming process is completed, the inside of the concave portion in the sidewall of the stacked structure in which the second material (SiGe) and the first material (Si) are alternately stacked can be buried with the film (SiOC) so that the sidewall of the stacked structure can be flattened. This makes it possible to omit a step of removing an extra film formed on the upper surface of the concave portion or the like by etching after the film forming process, which is indispensable in the conventional film forming method. Despite the formation of the film formation suppression layer on the surface of the first material, even if the film growth starting from the surface of the first material occurs very slightly for some reason, an extra film formed on the upper surface of the concave portion or the like is very small, and accordingly, it is possible to significantly reduce the load in the step of etching the extra film and significantly shorten the time required for etching. That is, according to the present embodiment, void-free and seamless burial is possible, which improves the burial characteristics, and further, it is possible to shorten the total processing time due to the omission of the step of etching the extra film or the reduction of the load of the step of etching the extra film, thereby improving the productivity.

(c) By setting the OH termination to be formed on the surface of the first material of the concave portion on the surface of the wafer 200 before performing step A, it is possible to promote adsorption of at least a portion of the molecular structure of molecules constituting the precursor on the surface of the first material of the concave portion, thereby appropriately forming the film formation suppression layer on the surface of the first material. Further, in that case, by setting the amount (density or concentration) of the OH termination on the surface of the first material (Si) before performing step A to be larger (higher) than the amount (density or concentration) of the OH termination on the surface of the second material (SiGe), at least a portion of the molecular structure of molecules constituting the precursor can be selectively (preferentially) adsorbed on the surface of the first material of the first material and the second material of the concave portion, thereby selectively (preferentially) forming the film formation suppression layer on the surface of the first material. It is also possible to make the surface of the second material not OH-terminated before performing step A, which makes it possible to enhance the selectivity in the selective adsorption of at least the portion of the molecular structure of molecules constituting the precursor on the surface of the first material and the selective formation of the film formation suppression layer on the surface of the first material.

(d) Before performing step A, by performing step C of forming the OH termination on the surface of the first material of the concave portion on the surface of the wafer 200, it is possible to promote the adsorption of at least the portion of the molecular structure of molecules constituting the precursor on the surface of the first material of the concave portion, thereby appropriately forming the film formation suppression layer on the surface of the first material. In step C, by supplying, for example, the oxidant as the reaction material to the wafer 200 to oxidize the surface of the first material, it is possible to form the OH terminations on the surface of the first material with efficiency and good controllability. In this case, in step C, the OH termination is also formed on the surface of the second material, but after performing step C and before performing step A, by performing step D of removing the OH termination formed on the surface of the second material, it is possible to create a state in which the OH termination is not formed on the surface of the second material. Further, in step D, by heating and annealing the wafer 200, it is possible to selectively sublimate and remove the oxide such as GeO formed on the surface of the second material (SiGe) while retaining (maintaining) the oxide film such as SiO formed on the surface of the first material (Si). That is, in step D, only by heating the wafer 200, it is possible to selectively remove the OH termination formed on the surface of the second material (SiGe) while retaining (maintaining) the OH termination formed on the surface of the first material (Si).

As a result, since the amount (density or concentration) of the OH termination on the surface of the first material (Si) before performing step A can be larger (higher) than the amount (density or concentration) of the OH termination on the surface of the second material (SiGe), it is possible to selectively (preferentially) adsorb at least the portion of the molecular structure of molecules constituting the precursor on the surface of the first material of the first material and the second material of the concave portion, thereby selectively (preferentially) forming the film formation suppression layer on the surface of the first material. Further, by sufficiently performing the annealing in step D, it is also possible to make the surface of the second material not OH-terminated before performing step A, which makes it possible to enhance the selectivity in the selective adsorption of at least the portion of the molecular structure of molecules constituting the precursor on the surface of the first material and the selective formation of the film formation suppression layer on the surface of the first material.

(e) Before performing step C, by performing step E of removing the native oxide film on the surfaces of the first material and the second material of the concave portion on the surface of the wafer 200, it is possible to remove the oxide film that may be formed non-uniformly on the surfaces of the first material and the second material, thereby removing the OH termination that may be formed non-uniformly on the surfaces of the first material and the second material. After that, by performing step C, the surface of the first material can be uniformly oxidized, thereby forming the oxide film uniformly on the surface of the first material. As a result, the OH termination can be uniformly formed on the surface of the first material. This makes it possible to more uniformly adsorb at least a portion of the molecular structure of molecules constituting the precursor on the surface of the first material of the concave portion in step A, thereby more uniformly forming the film formation suppression layer on the surface of the first material.

(f) After step B is completed, by performing post-treatment (PT) on the film formed so as to bury the inside of the concave portion with the temperature of the wafer 200 set to be equal to or higher than the temperature of the wafer 200 in step A or step B, preferably higher than the temperature of the wafer 200 in step A or step B, impurities contained in the film formed so as to bury the inside of the concave portion can be removed or defects contained in the film can be repaired. Further, the residual groups or residues of the film formation suppression layer on the surface of the first material, that is, the upper surface of the concave portion and the interface between the side surface of the concave portion and the film, can be desorbed. At this time, the post-treatment (PT) may be performed in a state where a inert gas is supplied into the process chamber 201, or may be performed in a state where a reactive substance such as an oxidant (oxidizing gas) is supplied into the into the process chamber 201. When the reactive substance such as the oxidant is supplied, it is possible to enhance the effect of desorbing the residual groups or residues of the film formation suppression layer on the upper surface of the concave portion and the interface between the side surface of the concave portion and the film.

(g) Since each reaction in each step can proceed under a non-plasma atmosphere, excessive reaction can be suppressed in each step, thereby enhancing the controllability of the reaction. Further, since each step is performed under the non-plasma atmosphere, plasma damage to the wafer 200 can be avoided, so that the present method can be applied to a process in which the plasma damage is a concern.

(4) Modifications

The substrate processing sequence in the present embodiment can be changed as in the following modifications. These modifications can be used in proper combination. Unless otherwise stated, the process procedures and process conditions in each step of each modification can be the same as the process procedures and process conditions in each step of the above-described substrate processing sequence.

(Modification 1)

As in the processing sequence shown below, step E (native oxide film removal) may be omitted depending on the surface condition of the wafer 200. For example, after forming on the surface of the wafer 200 the stacked structure in FIG. 5A in which the second material (SiGe) and the first material (Si) are alternately stacked, if the surface of the wafer 200 is not exposed to the air, the amount of air exposure is small, or the air exposure time is short, the surface of the first material or the surface of the second material may be in an appropriate surface state. In such a case, step E can be omitted, and the processing sequence can be started from step C (oxidation). This modification can also obtain the same effects as the above-described embodiment. Further, by omitting step E, it is possible to shorten the total processing time and improve the productivity.

Oxidant→ANL→Precursor→(Raw material+Catalyst→Oxidant+Catalyst)×$n$→PT (Modification 2)

As in the processing sequence shown below, step E (native oxide film removal) and step C (oxidation) may be omitted depending on the surface condition of the wafer 200. For example, when the oxide film is uniformly formed on the surfaces of the first material (Si) and the second material (SiGe) on the surface of the wafer 200, steps E and C can be omitted, and the processing sequence can be started from step D (ANL). This modification can also obtain the same effects as the above-described embodiment. Further, by omitting steps E and C, it is possible to shorten the total processing time and improve the productivity.

Oxidant→Precursor→(Raw material+Catalyst→Oxidant+Catalyst)×$n$→PT (Modification 3)

As in the processing sequence shown below, step E (native oxide film removal), step C (oxidation), and step D (ANL) may be omitted depending on the surface condition of the wafer 200. For example, when the oxide film is uniformly formed on the surfaces of the first material (Si) and the second material (SiGe) on the surface of the wafer 200 and the wafer 200 is heated to a temperature of, for example, 100 degrees C. in step A (film formation suppression layer formation), the oxide such as GeO formed on the surface of the second material can be sublimated and removed while retaining (maintaining) the oxide film such as the SiO film formed on the surface of the first material. That is, in step A, the OH terminal formed on the surface of the second material can be removed while retaining (maintaining) the OH terminal formed on the surface of the first material. In this case, steps E, C, and D can be omitted, and the processing sequence can be started from step A. This modification can also obtain the same effects as the above-described embodiment. Further, by omitting steps E, C, and D, it is possible to shorten the total processing time and improve the productivity.

Precursor→(Raw material+Catalyst→Oxidant+Catalyst)×$n$→PT (Modification 4)

As in the processing sequence shown below, in step B1, the raw material may be supplied alone without supplying the catalyst to the wafer 200. Further, in step B2, the oxidant may be supplied alone without supplying the catalyst to the wafer 200. By supplying the raw material and the catalyst to the wafer 200, it is possible to promote the chemical adsorption of at least a portion of the molecular structure of molecules constituting the raw material on the surface of the second material under a low temperature. Further, by supplying the oxidant and the catalyst to the wafer 200, the oxidation rate can be increased under the low temperature. However, the supply of the catalyst can be omitted when the chemical adsorption of at least the portion of the molecular structure of molecules constituting the raw material on the surface of the second material or the oxidation rate is adjusted by the temperature. This modification can also obtain the same effects as the above-described embodiment.

Etchant→Oxidant→ANL→Precursor→(Raw material→Oxidant+Catalyst)×$n$→PT

Etchant→Oxidant→ANL→Precursor→(Raw material+Catalyst→Oxidant)×$n$→PT

Etchant→Oxidant→ANL→Precursor→(Raw material→Oxidant)×$n$→PT (Modification 5)

As in the processing sequence shown below, step F (PT) may be omitted. For example, if the amount of impurities and the like contained in the film formed so as to bury the inside of the concave portion is within an allowable range, step F can be omitted. Further, when the film formation suppression layer or the like is allowed to remain on the upper surface of the concave portion and the interface between the side surface of the concave portion and the film, or even when the amount of residual groups, residues, and the like of the film formation suppression layer on the upper surface of the concave portion and the interface between the side surface of the concave portion and the film is within an allowable range, step F can be omitted. Further, when the film formation suppression layer and the like on the upper surface of the concave portion and the interface between the side surface of the concave portion and the film are removed by the reaction in each step of the film forming process, step F can be omitted. This modification can also obtain the same effects as the above-described embodiment. Further, by omitting step F, it is possible to shorten the total processing time and improve the productivity.

Etchant→Oxidant→ANL→Precursor→(Raw material+Catalyst→Oxidant+Catalyst)×$n$

Other Embodiments of the Present Disclosure

The embodiments of the present disclosure have been specifically described above. However, the present disclosure is not limited to the above-described embodiments, and various changes can be made without departing from the gist thereof.

For example, in step E, the etchant may be plasma-excited and supplied to the wafer 200. This makes it possible to increase the etching rate when etching the native oxide film. Further, in step C, the reaction material such as the oxidant may be plasma-excited and supplied to the wafer 200. This makes it possible to increase the oxidation rate. Further, in step D, the inert gas may be plasma-excited and supplied. This makes it possible to remove the oxide such as Geo formed on the surface of the second material by sublimation, and at the same time, treat the surface of the second material after the oxide is removed. Further, in step D, the assist substance may be plasma-excited and supplied. This makes it possible to further enhance the effect of desorbing the residual groups or residues of the film formation suppression layer on the upper surface of the concave portion and the interface between the side surface of the concave portion and the film.

Further, for example, in step B, in addition to the SiOC film and the SiO film, a silicon-based oxide film such as a silicon oxycarbonitride film (SiOCN film), a silicon oxynitride film (SiON film), a silicon oxyboronitride film (SiBON film), or a silicon oxyborocarbonitride film (SiBOCN film) may be formed. Further, in step B, for example, a metal-based oxide film such as an aluminum oxide film (AlO film), a titanium oxide film (TiO film), a hafnium oxide film (HfO film), or a zirconium oxide film (ZrO film) may be formed.

Recipes used in each process may be prepared individually according to the processing contents and may be stored in the memory 121c via a telecommunication line or the external memory 123. Moreover, at the beginning of each process, the CPU 121a may properly select an appropriate recipe from the recipes stored in the memory 121c according to the processing contents. Thus, it is possible for a single substrate processing apparatus to form films of various kinds, composition ratios, qualities, and thicknesses with enhanced reproducibility. Further, it is possible to reduce an operator's burden and to quickly start each process while avoiding an operation error.

The recipes mentioned above are not limited to newly-prepared ones but may be prepared, for example, by modifying existing recipes that are already installed in the substrate processing apparatus. Once the recipes are modified, the modified recipes may be installed in the substrate processing apparatus via a telecommunication line or a recording medium storing the recipes. In addition, the existing recipes already installed in the existing substrate processing apparatus may be directly modified by operating the input/output device 122 of the substrate processing apparatus.

An example in which a film is formed using a batch-type substrate processing apparatus capable of processing a plurality of substrates at a time has been described in the above-described embodiments. The present disclosure is not limited to the above-described embodiments, but may be suitably applied, for example, to a case where a film is formed using a single-wafer type substrate processing apparatus capable of processing a single substrate or several substrates at a time. In addition, an example in which a film is formed using a substrate processing apparatus provided with a hot-wall-type process furnace has been described in the above-described embodiments. The present disclosure is not limited to the above-described embodiments, but may be suitably applied to a case where a film is formed using a substrate processing apparatus provided with a cold-wall-type process furnace.

Even in the case of using these substrate processing apparatuses, each process may be performed according to the same processing procedures and process conditions as those in the above-described embodiments, and the same effects as the above-described embodiments are achieved.

The above-described embodiments may be used in proper combination. The processing procedures and process conditions used in this case may be the same as, for example, the processing procedures and process conditions in the above-described embodiments.

Examples

Figure 7:
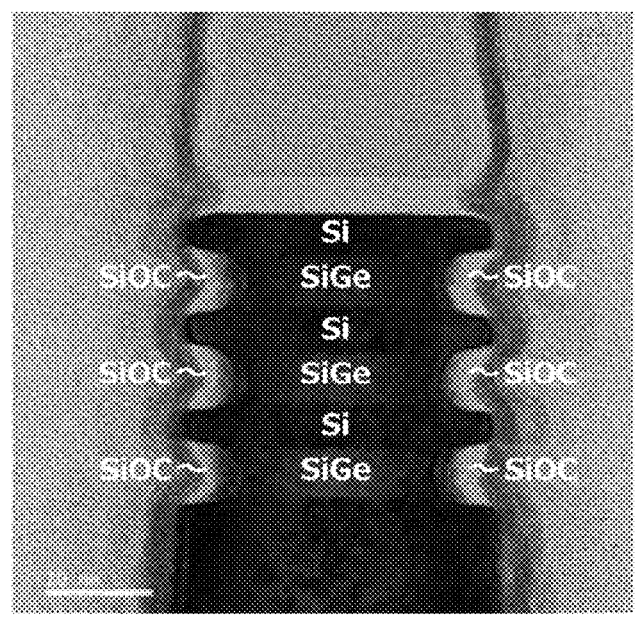
FIG. 7 is a cross-sectional TEM image of Evaluation Sample 1 in an Example.

Using the above-described substrate processing apparatus, as shown in FIG. 5A, by performing the processing sequence of the above-described embodiment on a wafer having a stacked structure in which a SiGe film and a Si film are alternately stacked on the surface of the wafer and having a concave portion with its upper surface and side surface composed of the Si film and its bottom surface composed of the SiGe film, whose depth direction is a direction (horizontal direction) parallel to the surface of the wafer, a SiOC film was formed so as to bury the inside of the concave portion to prepare Evaluation Sample 1. Then, a cross-sectional TEM image of Evaluation Sample 1 was taken. FIG. 7 shows the cross-sectional TEM image of Evaluation Sample 1.

Figure 8:
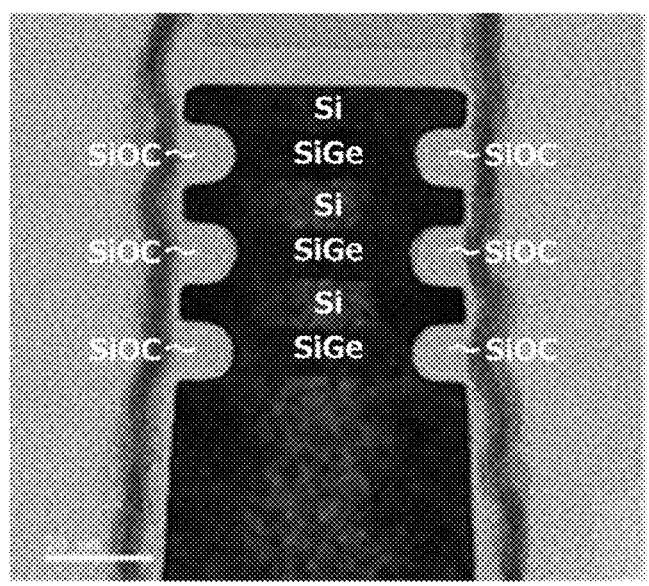
FIG. 8 is a cross-sectional TEM image of Evaluation Sample 2 in the Example.

Using the above-described substrate processing apparatus, by performing the processing sequence of the above-described Modification 3 on a wafer having the same configuration as the wafer used when preparing Evaluation Sample 1, a SiOC film was formed so as to bury the inside of the concave portion to prepare Evaluation Sample 2. Then, a cross-sectional TEM image of Evaluation Sample 2 was taken. FIG. 8 shows the cross-sectional TEM image of Evaluation Sample 2.

As shown in FIG. 7, in Evaluation Sample 1, it can be seen that the SiOC film is selectively formed only in the inside of the concave portion without being formed on the upper surface of the concave portion. Further, it can be seen that voids and seams are not generated in the SiOC film formed in the inside of the concave portion. Further, when preparing Evaluation Sample 1, by controlling (increasing) the number of cycles in step B, since the SiOC film is further selectively grown in the inside of the concave portion while suppressing growth of the SiOC film on the upper surface of the concave portion, it can be seen that it is possible to bury the inside of the concave portion on the sidewall of the stacked structure in which the SiGe film and the Si film are alternately stacked, with the SiOC film and flatten the sidewall of the stacked structure.

As shown in FIG. 8, in Evaluation Sample 2, it can be seen that a void-free and seamless SiOC film is formed so as to bury the inside of the concave portion. Further, in Evaluation Sample 2, although the SiOC film is slightly formed on the upper surface of the concave portion, it can be seen that the SiOC film has a flat profile on the sidewall of the stacked structure in which the SiGe film and the Si film are alternately stacked. In this case, by etching the SiOC film formed on the sidewall of the stacked structure in which the SiGe film and the Si film are alternately stacked, by the thickness of the SiOC film formed on the upper surface of the concave portion, the Si film on the sidewall of the stacked structure, that is, the upper surface (Si) of the concave portion, can be exposed while keeping the sidewall of the stacked structure flat. Further, when preparing Evaluation Sample 2, by controlling (decreasing) the number of cycles in step B to stop the film formation at the time when the inside of the concave portion is buried with the SiOC film, it can be seen that it is possible to flatten the sidewall of the stacked structure in which the SiGe film and the Si film are alternately stacked, without forming the SiOC film on the upper surface of the concave portion.

According to the present disclosure in some embodiments, it is possible to improve the burial characteristics when burying the inside of a concave portion with a film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the disclosures. The accompanying claims and their equivalents are intended to cover such forms or modifications as would fall within the scope of the disclosures.

What is claimed is:

1. A processing method comprising:
   (a) forming an inhibitor layer on a surface of a first material of a concave portion provided on a surface of a substrate, by supplying a precursor to the substrate to adsorb at least a portion of a molecular structure of molecules constituting the precursor on the surface of the first material of the concave portion, the concave portion being composed of the first material containing a first element and a second material containing a second element different from the first element;
   (b) growing a film on a surface of the second material of the concave portion by supplying a film-forming material to the substrate having the inhibitor layer formed on the surface of the first material; and
   (c) forming a hydroxyl group termination on the surface of the first material before performing (a).

2. The method of claim 1, wherein an amount of hydroxyl group terminations on the surface of the first material before performing (a) is larger than an amount of hydroxyl group terminations on the surface of the second material before performing (a).

3. The method of claim 1, wherein a density of hydroxyl group terminations on the surface of the first material before performing (a) is larger than a density of hydroxyl group terminations on the surface of the second material before performing (a).

4. The method of claim 1, wherein a hydroxyl group termination is not formed on the surface of the second material before performing (a).

5. The method of claim 1, wherein in (c), the hydroxyl group termination is formed on the surface of the first material by supplying a reaction material to the substrate to oxidize the surface of the first material.

6. The method of claim 1, wherein in (c), a hydroxyl group termination is formed on the surface of the second material, and
   wherein the method further comprises:
      (d) removing the hydroxyl group termination formed on the surface of the second material after performing (c) and before performing (a).

7. The method of claim 6, wherein in (c), the hydroxyl group termination is formed on the surface of the second material as the surface of the second material is oxidized,
   wherein in (d), the hydroxyl group termination formed on the surface of the second material is removed by heating the substrate to sublimate an oxide formed on the surface of the second material.

8. The method of claim 6, wherein in (d), the hydroxyl group termination formed on the surface of the second material is removed while retaining the hydroxyl group termination formed on the surface of the first material.

9. The method of claim 1, further comprising:
   (e) removing a native oxide film on the surfaces of the first material and the second material before performing (c).

10. The method of claim 1, the concave portion has a bottom surface composed of the second material.

11. The method of claim 10, the concave portion has at least one selected from the group of a top surface and a side surface composed of the first material.

12. The method of claim 10, wherein in (b), by growing the film on the surface of the second material of the concave portion, the film is grown bottom-up in an inside of the concave portion to bury the inside of the concave portion with the film.

13. The method of claim 1, wherein (b) includes:
   performing a cycle a predetermined number of times, the cycle including:
      (b1) supplying a raw material as the film-forming material to the substrate; and
      (b2) supplying a reactant as the film-forming material to the substrate.

14. The method of claim 13, wherein in at least one selected from the group of (b1) and (b2), a catalyst is further supplied as the film-forming material to the substrate.

15. The method of claim 1, wherein the second material further contains the first element.

16. The method of claim 1, wherein the first element is silicon, and the second element is germanium.

17. The method of claim 1, wherein the first material is silicon, and the second material is silicon germanium.

18. The method of claim 1, wherein in (b), a film containing silicon, oxygen, and carbon is grown as the film.

19. A method of manufacturing a semiconductor device, comprising:
   (a) forming an inhibitor layer on a surface of a first material of a concave portion provided on a surface of a substrate, by supplying a precursor to the substrate to adsorb at least a portion of a molecular structure of molecules constituting the precursor on the surface of the first material of the concave portion, the concave portion being composed of the first material containing a first element and a second material containing a second element different from the first element; and
   (b) growing a film on a surface of the second material of the concave portion by supplying a film-forming material to the substrate having the inhibitor layer formed on the surface of the first material,
   (c) forming a hydroxyl group termination on the surface of the first material before performing (a).

20. A processing apparatus comprising:
   a precursor supply system configured to supply a precursor to a substrate;
   a film-forming material supply system configured to supply a film-forming material to the substrate; and
   a controller configured to be capable of controlling an operation of the processing apparatus so as to perform a process including:
      (a) forming an inhibitor layer on a surface of a first material of a concave portion provided on a surface of the substrate, by supplying the precursor to the substrate to adsorb at least a portion of a molecular structure of molecules constituting the precursor on the surface of the first material of the concave portion, the concave portion being composed of the first material containing a first element and a second material containing a second element different from the first element; and
      (b) growing a film on a surface of the second material of the concave portion by supplying the film-forming material to the substrate having the inhibitor layer formed on the surface of the first material,
      (c) forming a hydroxyl group termination on the surface of the first material before performing (a).

21. A non-transitory computer-readable recording medium storing a program that causes, by a computer, a processing apparatus to perform a process comprising the method of claim 1.

* * * * *